United States Patent
Huang et al.

(10) Patent No.: US 12,052,099 B2
(45) Date of Patent: Jul. 30, 2024

(54) JOINT POLAR ENCODING OF MULTIPLE PAYLOADS WITH UNEQUAL ERROR PROTECTION

(71) Applicant: QUALCOMM Incorporated, San Diego, CA (US)

(72) Inventors: Yi Huang, San Diego, CA (US); Wei Yang, San Diego, CA (US); Hyojin Lee, San Diego, CA (US); Naga Bhushan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/713,945

(22) Filed: Apr. 5, 2022

(65) Prior Publication Data

US 2022/0321248 A1  Oct. 6, 2022

Related U.S. Application Data

(60) Provisional application No. 63/171,549, filed on Apr. 6, 2021.

(51) Int. Cl.
*H04L 1/00* (2006.01)
*H03M 13/13* (2006.01)
(Continued)

(52) U.S. Cl.
CPC ............ *H04L 1/007* (2013.01); *H03M 13/13* (2013.01); *H04L 1/0041* (2013.01); *H04L 1/0057* (2013.01); *H04L 1/1854* (2013.01)

(58) Field of Classification Search
CPC ..... H04L 1/007; H04L 1/0041; H04L 1/0057; H04L 1/1854; H03M 13/13
See application file for complete search history.

(56) References Cited

U.S. PATENT DOCUMENTS 10,649,204 B2 *  5/2020  Artzner ................. G02B 26/101
10,903,857 B2 *  1/2021  Noh ....................... H04L 1/0041
(Continued)

FOREIGN PATENT DOCUMENTS

WO   2018031715 A1   2/2018

OTHER PUBLICATIONS

Chiu M-C., et al., "Reduced-Complexity SCL Decoding of Multi-CRC-Aided Polar Codes", Sep. 28, 2016, pp. 1-9, XP055384603, Retrieved from the Internet: URL: https://arxiv.org/pdf/1609.08813.pdf [retrieved on Jun. 23, 2017] the whole document.

(Continued)

*Primary Examiner* — Justin R Knapp
(74) *Attorney, Agent, or Firm* — Loza & Loza, LLP

(57) ABSTRACT

The aspects described herein may enable an apparatus to jointly encode two or more payloads using a single polar encoder device, while providing unequal error protection for the payloads. The apparatus causes a polar encoder to polar encode a first payload and a second payload to generate a polar encoded codeword. The polar encoder is configured to encode one or more bits of the first payload at a first reliability level and encode one or more bits of the second payload at a second reliability level, where the one or more bits of the first payload are associated with a first priority level and the one or more bits of the second payload are associated with a second priority level. The apparatus transmits the polar encoded codeword.

27 Claims, 20 Drawing Sheets

(51) Int. Cl.
      *H04L 1/18*       (2023.01)
      *H04L 1/1829*       (2023.01)

(56) References Cited

U.S. PATENT DOCUMENTS

| | | | |
|---|---|---|---|
| 11,259,280 B2 * | 2/2022 | Xu | H04L 1/0057 |
| 11,533,733 B2 * | 12/2022 | Huang | H04J 11/003 |
| 11,646,830 B2 * | 5/2023 | Chen | H04L 1/1819 |
| | | | 370/329 |
| 2018/0198561 A1 * | 7/2018 | Tsai | H04L 27/3488 |
| 2020/0099393 A1 * | 3/2020 | Xu | H04W 72/21 |
| 2021/0337556 A1 * | 10/2021 | Huang | H04L 5/0007 |

OTHER PUBLICATIONS

Cui C., et al., "Polar Codes with the Unequal Error Protection Property", Computer Communications, Elsevier Science Publishers BV, Amsterdam, NL, vol. 123, Feb. 19, 2018, pp. 116-125, XP085387867, ISSN: 0140-3664, DOI:10.1016/J.COMCOM.2018. 02.013 section 3 "Unequal error protection polar codes", figure 1.
International Search Report and Written Opinion—PCT/US2022/023639—ISA/EPO—Jul. 25, 2022.
Liang H., et al., "Rateless Transmission of Polar Codes with Information Unequal Error Protection", IET Communications, The Institution of Engineering and Technology, GB, vol. 13, No. 12, Jul. 2019, pp. 1721-1727, XP006097549, ISSN: 1751-8628, DOI: 10.1049/IET-COM.2018.6194 section "2.3 UEP property of polar codes", figure 1.

\* cited by examiner

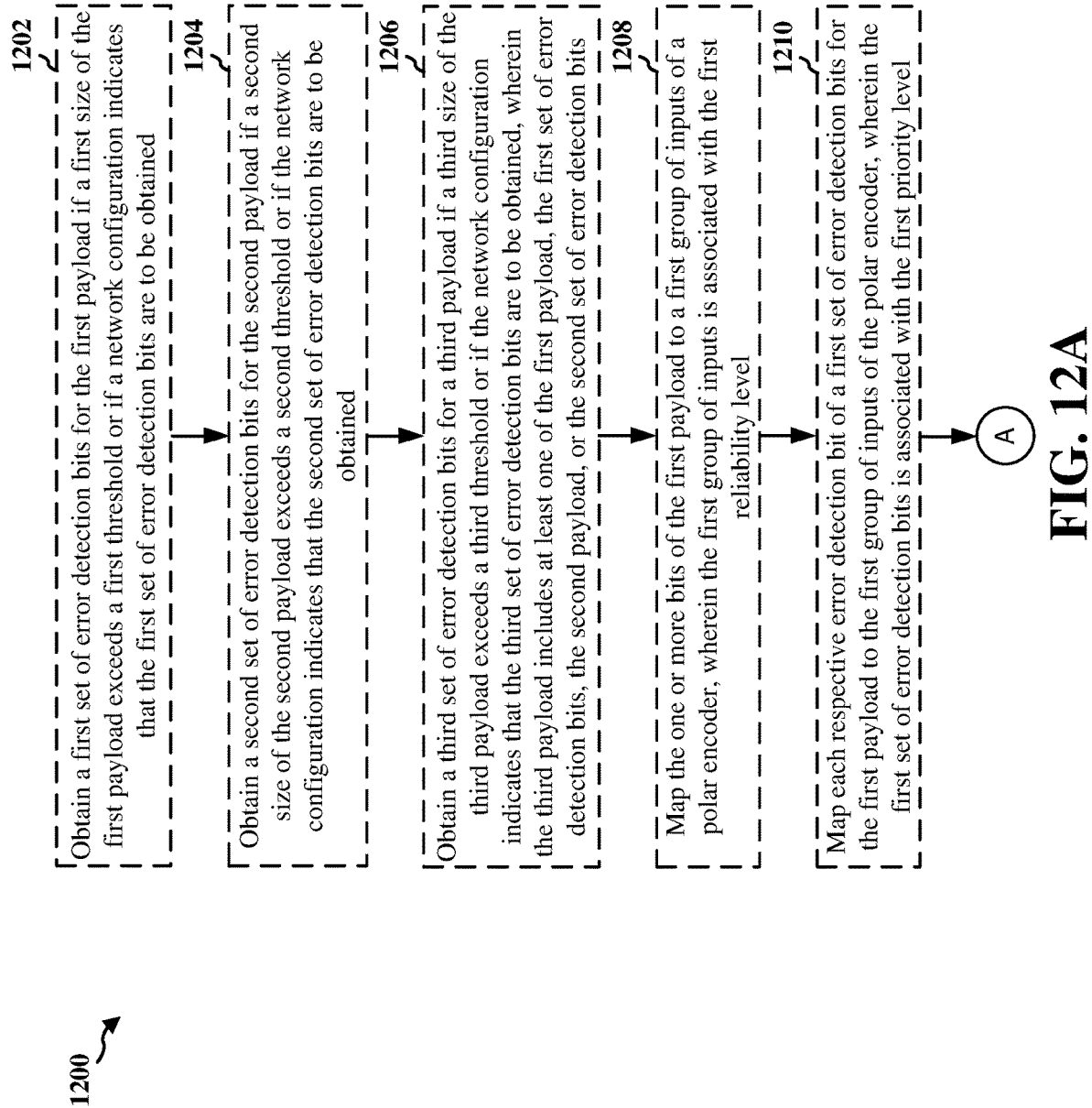

JOINT POLAR ENCODING OF MULTIPLE PAYLOADS WITH UNEQUAL ERROR PROTECTION

CROSS REFERENCE TO RELATED APPLICATION(S)

This application claims the benefit of U.S. Provisional Application Ser. No. 63/171,549, entitled "JOINT POLAR ENCODING OF MULTIPLE PAYLOADS WITH UNEQUAL ERROR PROTECTION" and filed on Apr. 6, 2021, which is expressly incorporated by reference herein in its entirety.

BACKGROUND

Technical Field

The present disclosure relates generally to communication systems, and more particularly, to joint polar encoding of multiple payloads with unequal error protection.

Introduction

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

A wireless communication device may need to transmit multiple payloads in a single transmission. However, one or more of the multiple payloads may have different transmission reliability requirements relative other payloads of the multiple payloads. For example, a high priority payload may need to be channel encoded to have a smaller decoding error at a receiver device relative to a low priority payload that may tolerate a larger decoding error at the receiver device.

The aspects described herein may enable an apparatus (e.g., a wireless communication device, such as a UE or a base station) to achieve joint encoding of two or more payloads using a single polar encoder, while providing unequal error protection for the two or more payloads. For example, the aspects described herein enable the apparatus to encode two or more payloads into a single polar encoded codeword for wireless transmission. The bits in the polar encoded codeword corresponding to a higher priority payload may be transmitted with higher transmission reliability than the bits in the codeword corresponding to a lower priority payload. Thus, a smaller decoding error may be achieved for the higher priority payload, while a larger decoding error may occur for the lower priority payload.

In an aspect of the disclosure, a method, a computer-readable medium, and an apparatus are provided. The apparatus includes a memory; and at least one processor coupled to the memory, wherein the at least one processor includes a polar encoder, and wherein the at least one processor is configured to: cause the polar encoder to polar encode a first payload and a second payload to generate a polar encoded codeword, wherein, to polar encode the first payload and the second payload to generate the polar encoded codeword, the polar encoder is configured to encode one or more bits of the first payload at a first reliability level and encode one or more bits of the second payload at a second reliability level, wherein the one or more bits of the first payload are associated with a first priority level and the one or more bits of the second payload are associated with a second priority level; and transmit the polar encoded codeword.

In an aspect of the disclosure, a method, a computer-readable medium, and an apparatus are provided. The apparatus polar encodes at least a first payload and a second payload at a polar encoder device to generate a polar encoded codeword, and transmits the polar encoded codeword. One or more bits of the polar encoded codeword associated with the first payload are transmitted with a first transmission reliability level and one or more bits of the polar encoded codeword associated with the second payload are transmitted with a second transmission reliability level.

In an aspect of the disclosure, a method, a computer-readable medium, and an apparatus are provided. The apparatus maps one or more bits of a first payload associated with a first priority level to a first group of inputs of a polar encoder device. The first group of inputs may be associated with a first transmission reliability level. The apparatus further maps one or more bits of a second payload associated with a second priority level to a second group of inputs of the polar encoder device. The second group of inputs may be associated with a second transmission reliability level. The apparatus transmits a codeword generated at the polar encoder device based at least on the one or more bits of the first payload and the one or more bits of the second payload.

In some examples, the first priority level is higher than the second priority level, and wherein the first transmission reliability level is higher than the second transmission reliability level. In some examples, any of the first group of inputs associated with the first transmission reliability level provides higher transmission reliability than any of the second group of inputs associated with the second transmission reliability level.

In some aspects of the disclosure, the apparatus obtains a first set of error detection bits for the first payload and a second set of error detection bits for the second payload, wherein the first set of error detection bits is associated with the first priority level and the second set of error detection bits is associated with the second priority level, maps each of the first set of error detection bits to the first group of inputs of the polar encoder device, and maps each of the second set of error detection bits to the second group of inputs of the polar encoder device. The codeword generated at the polar encoder device is further based on the first set of error detection bits and the second set of error detection bits.

In some examples, the first set of error detection bits for the first payload is obtained when a first number of bits in the first payload exceeds a threshold, and the second set of error detection bits for the second payload is obtained when a second number of bits in the second payload exceeds the threshold.

In some aspects of the disclosure, the apparatus obtains a third set of error detection bits for a third payload including the first payload, the first set of error detection bits, the second payload, and the second set of error detection bits, wherein the third set of error detection bits is associated with a third priority level, and maps each of the third set of error detection bits to a third group of inputs of the polar encoder device, wherein the third group of inputs is associated with a third transmission reliability level, and wherein the codeword generated at the polar encoder device is further based on the third set of error detection bits.

In some examples, at least the second set of error detection bits or the third set of error detection bits are obtained based on a configuration or signaling from a network. In some examples, the first priority level is higher than the second and third priority levels, the third priority level is higher than the second priority level, the first transmission reliability level is higher than the second and third transmission reliability levels, and the third transmission reliability level is higher than the second transmission reliability level.

In some examples, any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

In some examples, the third priority level is higher than the first and second priority levels, the first priority level is higher than the second priority level, the third transmission reliability level is higher than the first and second transmission reliability levels, and the first transmission reliability level is higher than the second transmission reliability level.

In some examples, any of the third group of inputs associated with the third transmission reliability level provides higher transmission reliability than any of the first group of inputs associated with the first transmission reliability level and any of the second group of inputs associated with the second transmission reliability level, and any of the first group of inputs associated with the first transmission reliability level provides higher transmission reliability than any of the second group of inputs associated with the second transmission reliability level.

In some aspects of the disclosure, the apparatus obtains a first set of error detection bits for the first payload if a first size of the first payload exceeds a first threshold or if a network configuration indicates that the first set of error detection bits are to be obtained, obtaining a second set of error detection bits for the second payload if a second size of the second payload exceeds a second threshold or if the network configuration indicates that the second set of error detection bits are to be obtained, and obtains a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

In some examples, the first set of error detection bits is associated with the first priority level, the second set of error detection bits is associated with the second priority level, and the third set of error detection bits is associated with a third priority level. In some aspects of the disclosure, if the first set of error detection bits is obtained, the apparatus maps each of the first set of error detection bits to the first group of inputs of the polar encoder device, wherein the first group of inputs is associated with a first transmission reliability level. If the second set of error detection bits is obtained, the apparatus maps each of the second set of error detection bits to the second group of inputs of the polar encoder device, wherein the second group of inputs is associated with a second transmission reliability level. If the third set of error detection bits is obtained, the apparatus maps each of the third set of error detection bits to the third group of inputs of the polar encoder device, wherein the third group of inputs is associated with a third transmission reliability level.

In some examples, the codeword generated at the polar encoder device is further based on at least one of the first set of error detection bits, the second set of error detection bits, or the second set of error detection bits. In some examples, the first priority level is higher than the second and third priority levels, the third priority level is higher than the second priority level, the first transmission reliability level is higher than the second and third transmission reliability levels, and the third transmission reliability level is higher than the second transmission reliability level.

In some examples, any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

In some aspects of the disclosure, a method of wireless communication includes concatenating a first payload, any error detection bits associated with the first payload, a second payload, and any error detection bits associated with the second payload to generate a first concatenated payload, wherein the first payload and the error detection bits associated with the first payload are associated with a first priority level, and wherein the second payload and the error detection bits associated with the second payload are associated with a second priority level, obtaining error detection bits for the first concatenated payload, concatenating the first concatenated payload and the error detection bits for the first concatenated payload to generate a second concatenated payload, sequentially mapping bits of the second concatenated payload to a plurality of inputs of a polar encoder device according to increasing indices of the plurality of inputs, wherein a first bit of the second concatenated payload is mapped to an input in the plurality of inputs providing a highest transmission reliability, and transmitting a codeword generated at the polar encoder device based at least on the bits of the second concatenated payload.

In some examples, the plurality of inputs excludes frozen bits.

In some aspects of the disclosure, a method of wireless communication includes receiving a wireless transmission including a codeword encoded using a polar code, decoding the codeword at a polar decoder to obtain a set of decoded bits; and segmenting the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

In some aspects of the disclosure, the method of wireless communication further includes performing a first error detection operation for the first payload using the first set of error detection bits, and performing a second error detection operation for the second payload using the second set of error detection bits.

In some aspects of the disclosure, an apparatus for wireless communication includes means for mapping one or more bits of a first payload associated with a first priority level to a first group of inputs of a polar encoder device, wherein the first group of inputs is associated with a first transmission reliability level, means for mapping one or more bits of a second payload associated with a second priority level to a second group of inputs of the polar encoder device, wherein the second group of inputs is associated with a second transmission reliability level, and means for transmitting a codeword generated at the polar encoder device based at least on the one or more bits of the first payload and the one or more bits of the second payload.

In some aspects of the disclosure, an apparatus for wireless communication includes a memory and at least one processor coupled to the memory. The processor is configured to map one or more bits of a first payload associated with a first priority level to a first group of inputs of a polar encoder device, wherein the first group of inputs is associated with a first transmission reliability level, map one or more bits of a second payload associated with a second priority level to a second group of inputs of the polar encoder device, wherein the second group of inputs is associated with a second transmission reliability level, and transmit a codeword generated at the polar encoder device based at least on the one or more bits of the first payload and the one or more bits of the second payload.

In some aspects of the disclosure, a computer-readable medium storing computer executable code is provided. The code when executed by a processor cause the processor to: map one or more bits of a first payload associated with a first priority level to a first group of inputs of a polar encoder device, wherein the first group of inputs is associated with a first transmission reliability level, map one or more bits of a second payload associated with a second priority level to a second group of inputs of the polar encoder device, wherein the second group of inputs is associated with a second transmission reliability level, and transmit a codeword generated at the polar encoder device based at least on the one or more bits of the first payload and the one or more bits of the second payload.

In some aspects of the disclosure, an apparatus for wireless communication includes means for receiving a wireless transmission including a codeword encoded using a polar code, means for decoding the codeword at a polar decoder to obtain a set of decoded bits, and means for segmenting the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

In some aspects of the disclosure, an apparatus for wireless communication includes a memory and at least one processor coupled to the memory. The processor is configured to: receive a wireless transmission including a codeword encoded using a polar code; decode the codeword at a polar decoder to obtain a set of decoded bits; and segment the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

In some aspects of the disclosure, a computer-readable medium storing computer executable code is provided. The code when executed by a processor cause the processor to: receive a wireless transmission including a codeword encoded using a polar code; decode the codeword at a polar decoder to obtain a set of decoded bits; and segment the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIGS. 12A and 12B are a flowchart of a method of wireless communication.

DETAILED DESCRIPTION

Figure 1:
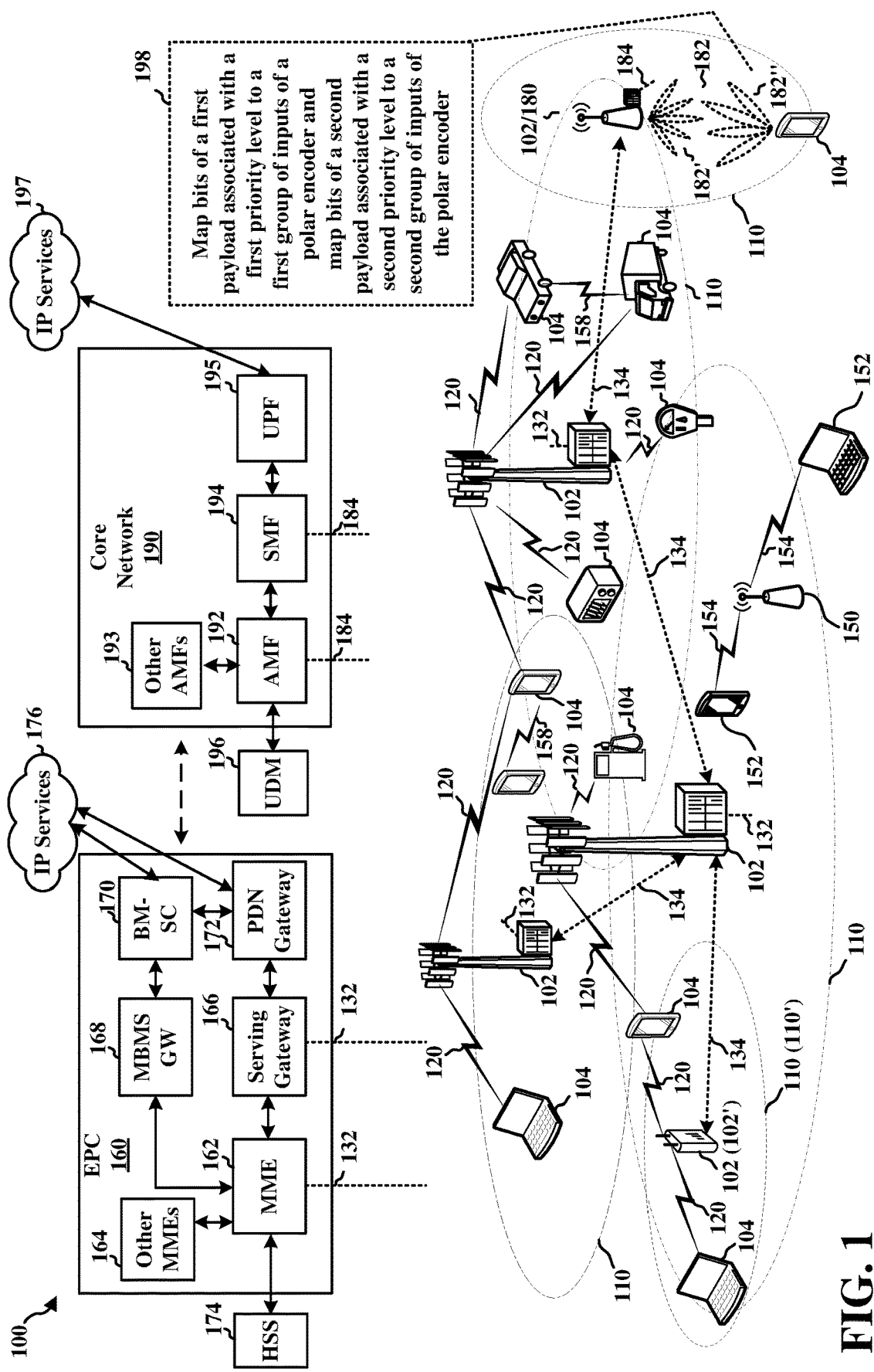
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through backhaul links 132 (e.g., S1 interface). The base stations 102 configured for 5G NR (collectively referred to as Next Generation RAN (NG-RAN)) may interface with core network 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or another type of base station. Some base stations, such as gNB 180 may operate in a traditional sub 6 GHz spectrum, in millimeter wave (mmW) frequencies, and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band (e.g., 3 GHz-300 GHz) has extremely high path loss and a short range. The mmW base station 180 may utilize beamforming 182 with the UE 104 to compensate for the extremely high path loss and short range.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the UE 104 may be configured to map bits of a first payload associated with a first priority level to a first group of inputs of a polar encoder device and map bits of a second payload associated with a second priority level to a second group of inputs of the polar encoder device (198). Although the following description may be focused on 5G NR, the concepts described herein may be applicable to other similar areas, such as LTE, LTE-A, CDMA, GSM, and other wireless technologies.

Figure 2:
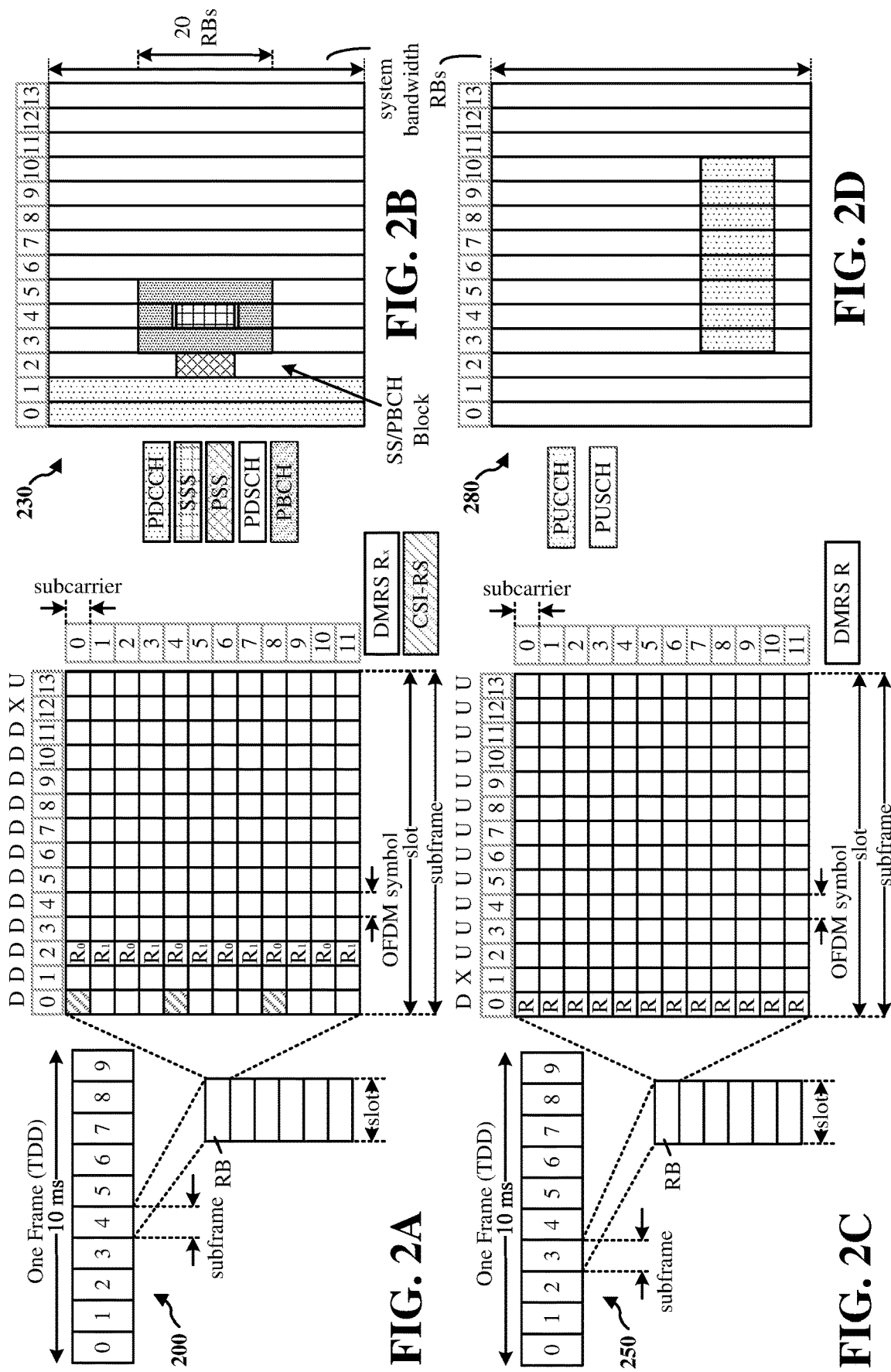
FIGS. 2A, 2B, 2C, and 2D are diagrams illustrating examples of a first 5G/NR frame, DL channels within a 5G/NR subframe, a second 5G/NR frame, and UL channels within a 5G/NR subframe, respectively.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies µ 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology µ, there are 14 symbols/slot and 2 slots/subframe. The subcarrier spacing and symbol length/duration are a function of the numerology. The subcarrier spacing may be equal to $2^\mu * 15$ kKz, where µ is the numerology 0 to 5. As such, the numerology µ=0 has a subcarrier spacing of 15 kHz and the numerology µ=5 has a subcarrier spacing of 480 kHz. The symbol length/duration is inversely related to the subcarrier spacing. FIGS. 2A-2D provide an example of slot configuration 0 with 14 symbols per slot and numerology µ=0 with 1 slot per subframe. The subcarrier spacing is 15 kHz and symbol duration is approximately 66.7 µs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. Although not shown, the UE may transmit sounding reference signals (SRS). The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
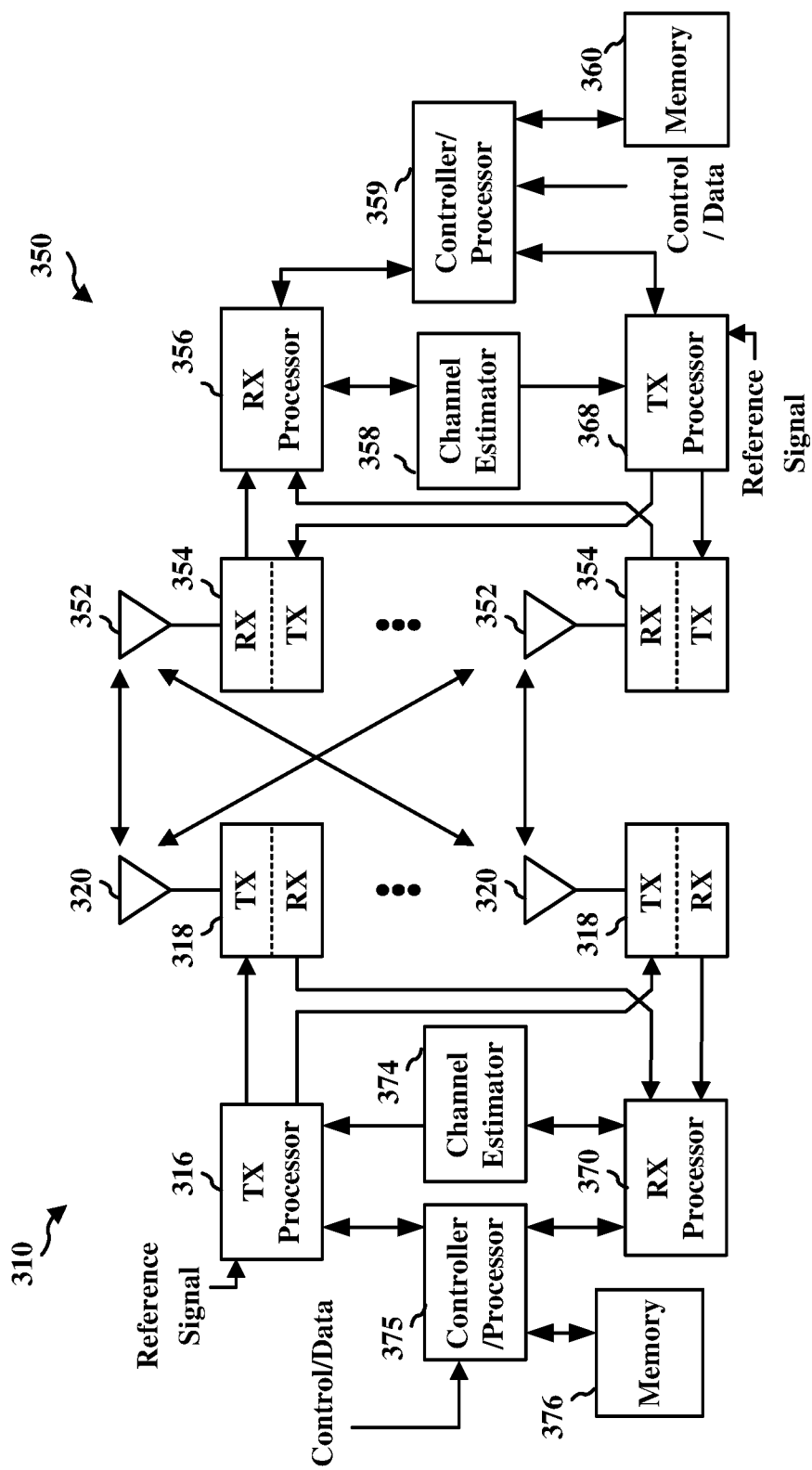
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each sub-carrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/ processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1.

Figure 4:
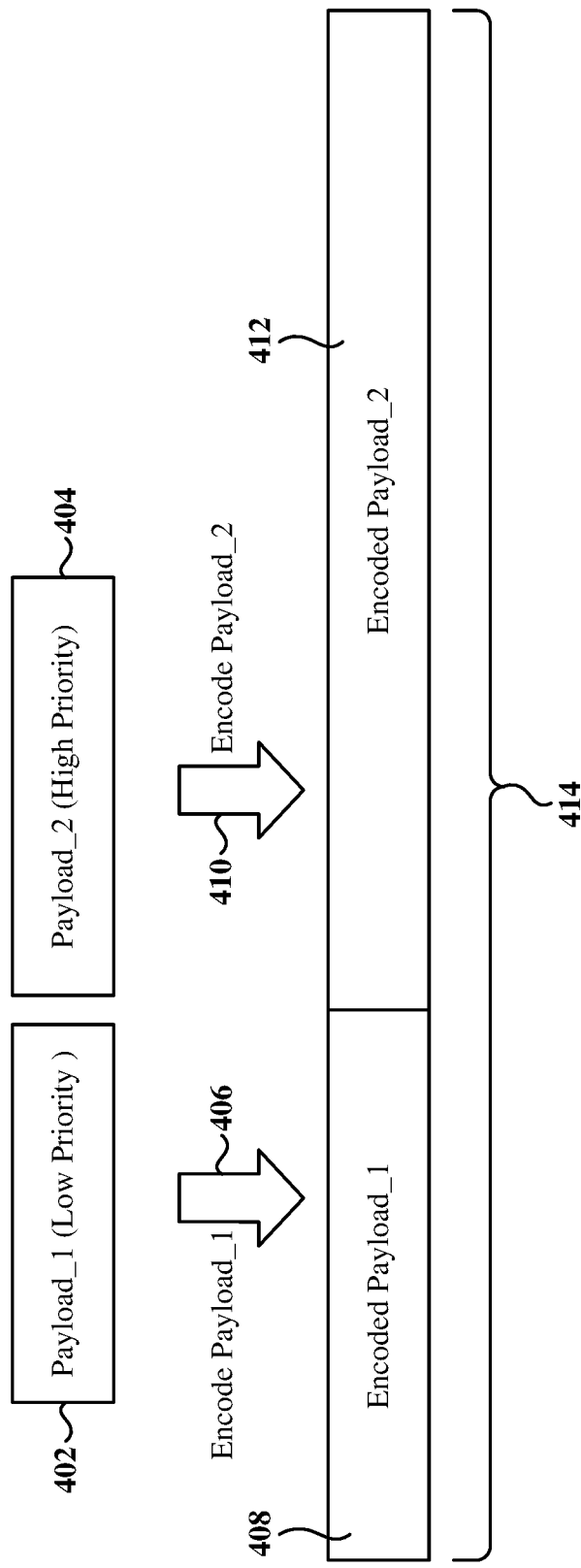
FIG. 4 illustrates an approach for separate encoding of payloads with different levels of error protection.

FIG. 4 illustrates an approach for separate encoding of payloads with different levels of error protection. As shown in FIG. 4, a first payload (payload_1) 402 including low priority information bits may be encoded 406 (e.g., at a physical (PHY) layer) to generate a first encoded payload 408. A second payload (payload_2) 404 including high priority information bits may be encoded 410 (e.g., at the PHY layer) to generate a second encoded payload 412. In some examples, the first and second encoded payloads 408, 412 may be generated using the same type of encoder or different types of encoders. In some examples, the different encoders may apply different error correction codes and/or different coding rates. In one example, the first and second encoded payloads 408, 412 may be generated using a forward error correction (FEC) code, such as a low-density parity-check (LDPC) code, turbo code, polar code, or other suitable error correction code. The first and second encoded payloads 408, 412 may be concatenated to form a concatenated encoded payload 414.

In some examples, the first and second encoded payloads 408, 412 may be generated with different levels of error protection (also referred to as unequal error protection). For example, the second payload (payload_2) 404 including high priority information bits may be encoded with a lower code rate than the first payload (payload_1) 402 including low priority information bits. Therefore, in some examples, the second encoded payload 412 may include more redundant bits than the first encoded payload 408 and, therefore, may have a higher transmission reliability than the first encoded payload 408. Thus, the first and second encoded payloads 408, 412 in the concatenated encoded payload 414 may have unequal error protection.

Figure 5:
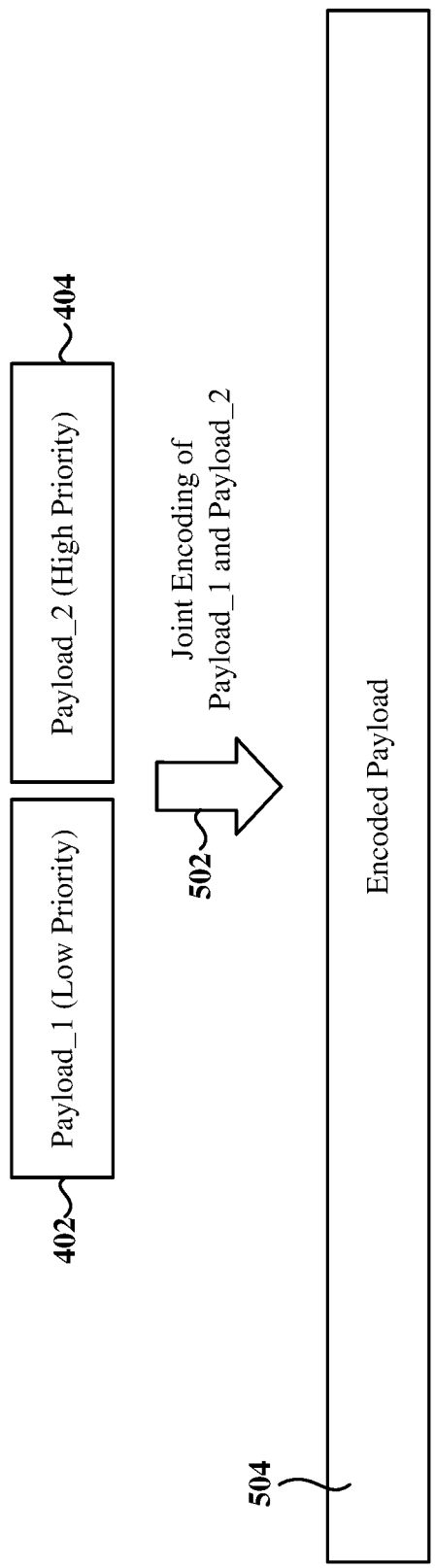
FIG. 5 illustrates an approach for joint encoding of payloads with different levels of error protection.

FIG. 5 illustrates an approach for joint encoding of payloads with different levels of error protection. As shown in FIG. 4, the first payload (payload_1) 402 including low priority information bits and the second payload (payload_2) 404 including high priority information bits may be jointly encoded 502 (e.g., at a physical (PHY) layer) to generate an encoded payload 504. The encoded payload 504 may include encoded bits for the first and second payloads 402, 404. In some examples, the first and second payloads 402, 404 may be jointly encoded 502 using a single encoder.

In some examples, the encoding technique applied by an encoder configured to perform the joint encoding 502 of the first and second payloads 402, 404 may provide unequal error protection for the first and second payloads 402, 404. For example, the high priority information bits of the second payload (Payload_2) 404 included in the encoded payload 504 may be received and decoded with a higher reliability than the low priority information bits of the first payload (Payload_1) 402.

Figure 6:
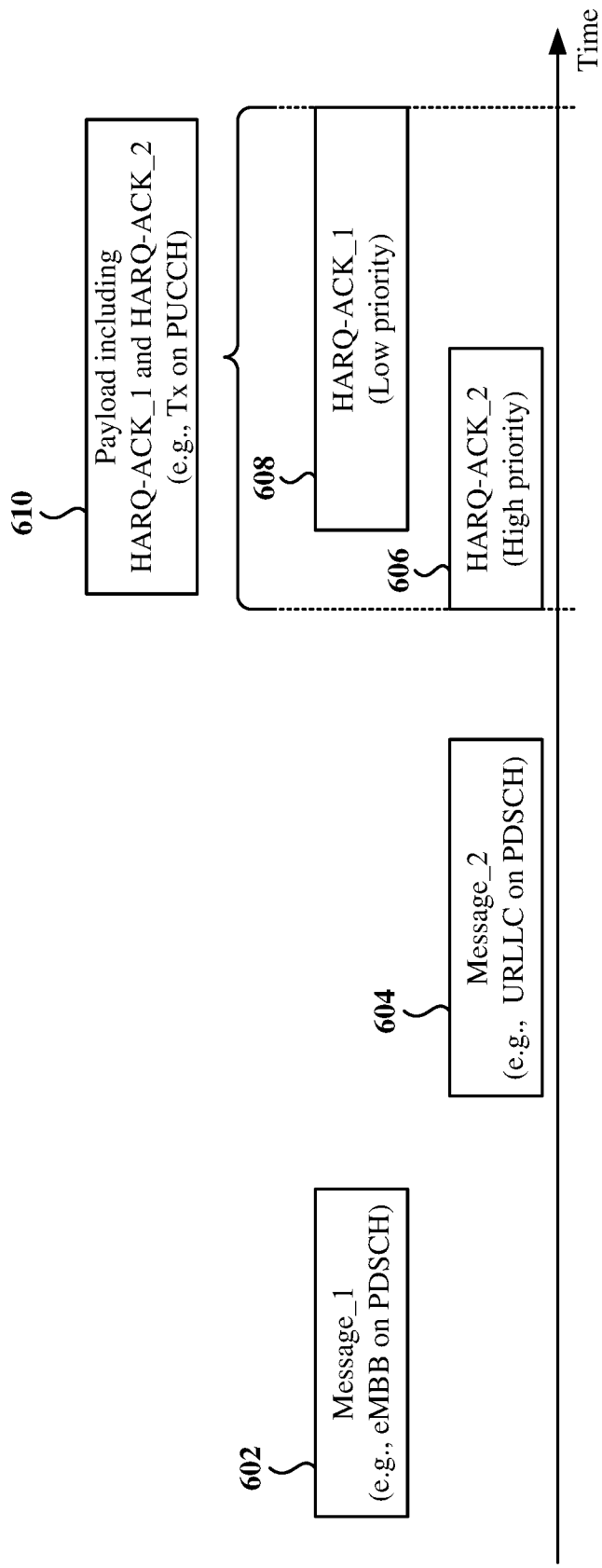
FIG. 6 illustrates an example use case for the joint encoding of payloads with different levels of error protection.

FIG. 6 illustrates an example use case for the joint encoding described with reference to FIG. 5. As shown in FIG. 6, a UE may receive a first message (Message_1) 602 from a base station. For example, the first message (Message_1) 602 may be a message associated with an enhanced mobile broadband (eMBB) service received on PDSCH. The UE may further receive a second message (Message_2) 604 from the base station. For example, the second message (Message_2) 604 may be a message associated with an ultra reliable low latency communications (URLLC) service received on PDSCH.

The UE may generate a high priority HARQ acknowledgment (HARQ-ACK_2) 606 for the second message (Message_2) 604 and a low priority HARQ acknowledgment (HARQ-ACK_1) 608 for the first message (Message_1) 602. In the scenario of FIG. 6, since the period for transmitting the high priority HARQ acknowledgment (HARQ-ACK_2) 606 and the period for transmitting the low priority HARQ acknowledgment (HARQ-ACK_1) 608 on PUCCH overlap in the time domain, the UE may merge (e.g., multiplex) the high priority HARQ acknowledgment (HARQ-ACK_2) 606 and the low priority HARQ acknowledgment (HARQ-ACK_1) 608 in a single encoded payload 610 using joint encoding.

In some examples, the encoded payload 610 may provide unequal error protection for the information bits of the high priority HARQ acknowledgment (HARQ-ACK_2) 606 and the information bits of the low priority HARQ acknowledgment (HARQ-ACK_1) 608. For example, the high priority information bits of the HARQ acknowledgment (HARQ-ACK_2) 606 included in the encoded payload 610 may be received and decoded with a higher reliability than the low priority information bits of the HARQ acknowledgment (HARQ-ACK_1) 608. In other words, there may be a smaller decoding error for the high priority information bits of the HARQ acknowledgment (HARQ-ACK_2) 606 and a larger decoding error for the low priority information bits of the HARQ acknowledgment (HARQ-ACK_1) 608 when decoding the encoded payload 610.

In some aspects of the disclosure, a single polar encoder may be configured to jointly encode a high priority payload (e.g., the high priority information bits of the HARQ acknowledgment (HARQ-ACK_2) 606) and a low priority payload (e.g., the low priority information bits of the HARQ acknowledgment (HARQ-ACK_1) 608) to generate an encoded payload (e.g., encoded payload 610). In some aspects, the encoded payload (e.g., encoded payload 610) may provide unequal error protection for the high priority payload and the low priority payload.

Figure 7:
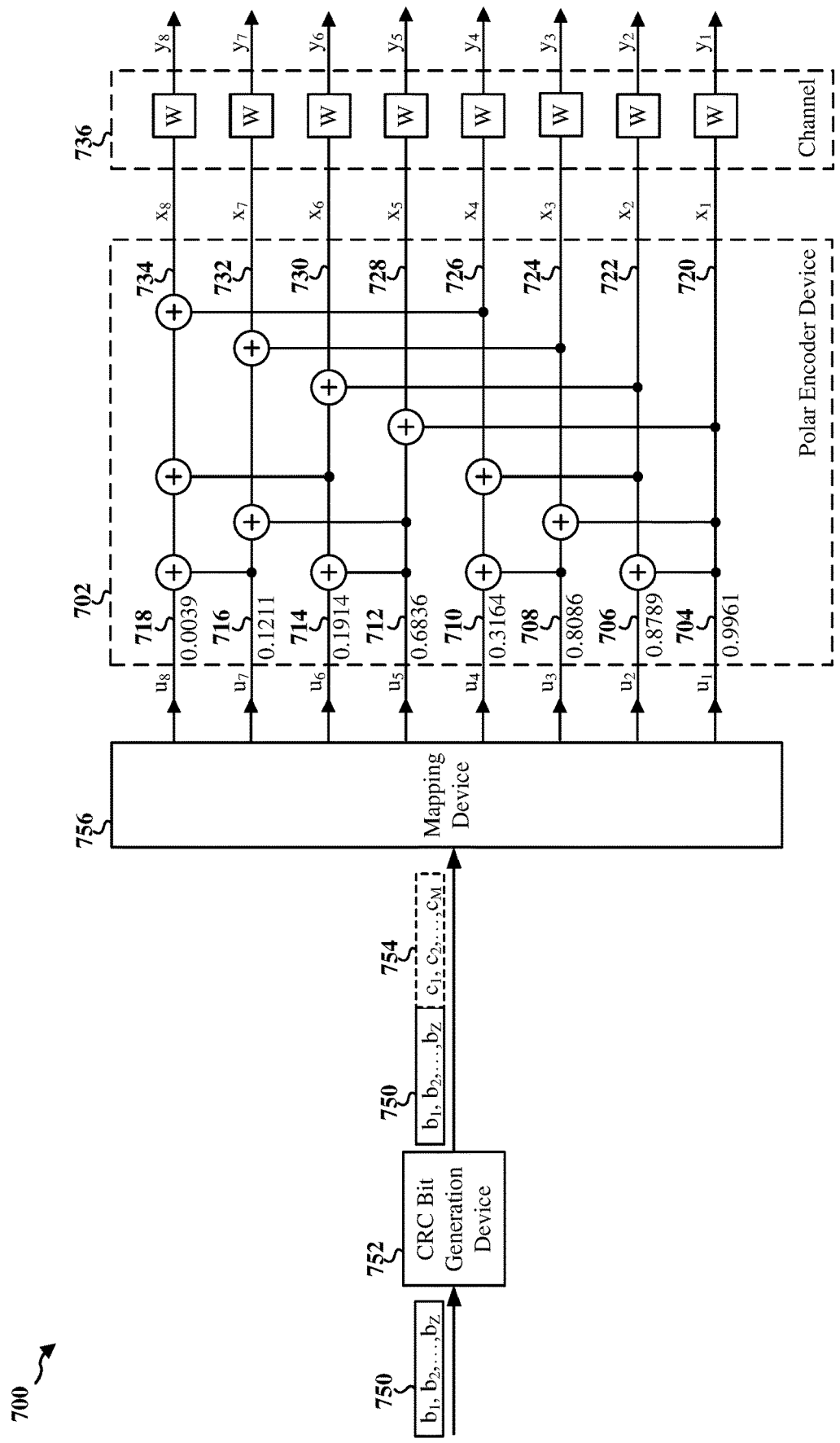
FIG. 7 illustrates an example encoding system including a polar encoder device, a cyclic redundancy check (CRC) bit generation device, and a mapping device.

FIG. 7 illustrates an example encoding system 700 including a polar encoder device 702, a cyclic redundancy check (CRC) bit generation device 752, and a mapping device 756. In some examples, the example encoding system 700 may be implemented in a wireless communication device, such as a UE, base station, or other type of wireless communication device.

The features of the 8-bit polar encoder device 702 will now be described. The polar encoder device 702 may include eight encoder input lines 704, 706, 708, 710, 712, 714, 716, 718, which may be configured to receive respective inputs $u_1$, $u_2$, $u_3$, $u_4$, $u_5$, $u_6$, $u_7$, $u_8$. The encoder input lines 704, 706, 708, 710, 712, 714, 716, 718 of the polar encoder device 702 may be associated with different channel capacities (also referred to as ranks, reliability levels, or error protection levels). For example, encoder input lines associated with higher channel capacity values may provide a higher transmission reliability for transmission of an input bit (e.g., a bit applied to encoder input $u_1$) relative to encoder input lines associated with lower channel capacity values.

In one example, and as indicated in FIG. 7, the encoder input lines 704 through 718 may be associated with respective channel capacity values 0.9961, 0.8789, 0.8086, 0.3164, 0.6836, 0.1914, 0.1211, and 0.0039. For example, a bit applied to encoder input $u_1$ at the encoder input line 704 may be transmitted with the highest reliability, while a bit applied to encoder input $u_8$ at the encoder input line 718 may be transmitted with the lowest reliability. Therefore, the polar encoder device 702 may naturally provide different levels of error protection at different encoder input locations (e.g., at the encoder input lines 704, 706, 708, 710, 712, 714, 716, 718).

The polar encoder device 702 may encode a set of input bits applied to encoder inputs $u_1$, $u_2$, $u_3$, $u_4$, $u_5$, $u_6$, $u_7$, $u_8$ to provide a respective set of output bits at encoder outputs $x_1$, $x_2$, $x_3$, $x_4$, $x_5$, $x_6$, $x_7$, $x_8$. The set of output bits at the encoder outputs $x_1$, $x_2$, . . . , $x_8$ may be transmitted over a channel (W) 736 to a receiver device. The values $y_1$, $y_2$, $y_3$, $y_4$, $y_5$, $y_6$, $y_7$, $y_8$ may represent the bit values received at the receiver device over the channel 736. In some examples, the receiver device may decode the bit values $y_1$, $y_2$, . . . , $y_8$ to determine the corresponding set of input bits applied to the inputs $u_1$, $u_2$, $u_3$, $u_4$, $u_5$, $u_6$, $u_7$, $u_8$.

In an example operation of the encoding system 700, a payload 750 to be wirelessly transmitted to a receiving device may be provided to the CRC bit generation device 752. For example, the payload 750 may include information bits b1, b2, . . . , $b_Z$ and the CRC bit generation device 752 may generate a set of CRC bits 754 (e.g., bits $c_1$, $c_2$, . . . , $c_M$) for the payload 750. The payload 750 and the set of CRC bits 754 may be provided to the mapping device 756.

The mapping device 756 may map the information bits (e.g., b1, b2, . . . , $b_Z$) of the payload 750 and the CRC bits 754 (e.g., bits $c_1$, $c_2$, . . . , $c_M$) to the inputs (e.g., $u_1$, $u_2$, $u_3$, $u_4$, $u_5$, $u_6$, $u_7$, $u_8$) of the polar encoder device 702 based on one or more criteria. In some examples, the mapping device 756 may map each of the information bits (e.g., b1, b2, . . . , $b_Z$) of the payload 750 and each of the CRC bits 754 (e.g., bits $c_1$, $c_2$, . . . , $c_M$) to inputs associated with higher channel capacity values and may apply frozen bits (also referred to as dummy bits) to the inputs associated with lower channel capacity values.

For example, the mapping device 756 may map the information bits (e.g., b1, b2, . . . , $b_Z$) of the payload 750 and the CRC bits 754 (e.g., bits $c_1$, $c_2$, . . . , $c_M$) to the inputs of the polar encoder device 702 such that each of the inputs $u_1$, $u_2$, $u_3$, and $u_5$ may be an information bit of the payload 750 or a CRC bit from the set of CRC bits 754, while the inputs $u_4$, $u_6$, $u_7$, and $u_8$ may be frozen bits.

Figure 8:
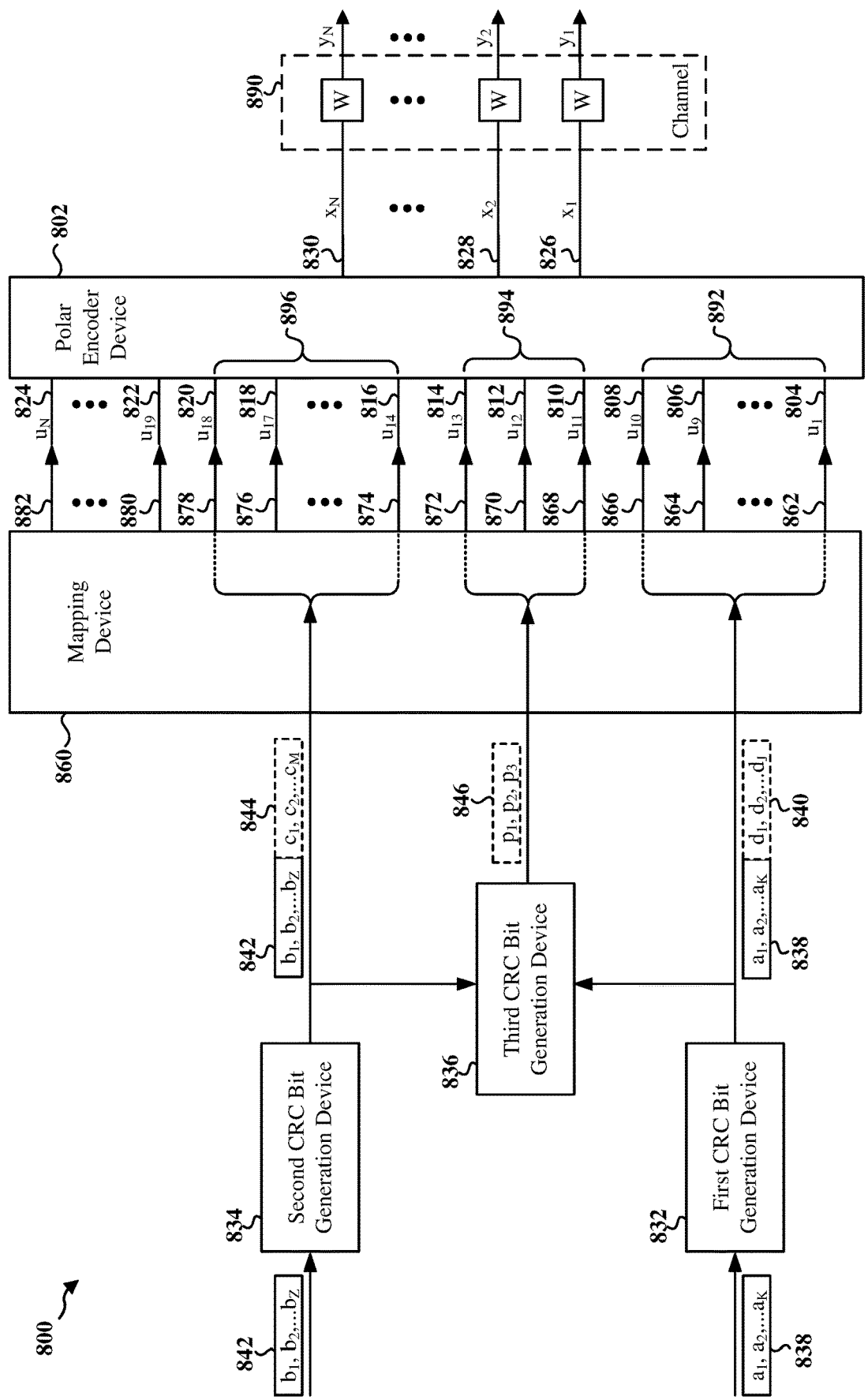
FIG. 8 illustrates an example encoding system including a polar encoder device, a first CRC bit generation device, a second CRC bit generation device, a third CRC bit generation device, and a mapping device in accordance with various aspects of the present disclosure.

FIG. 8 illustrates an example encoding system 800 including a polar encoder device 802, a first cyclic redundancy check (CRC) bit generation device 832, a second CRC bit generation device 834, a third CRC bit generation device 836, and a mapping device 860. In some examples, the encoding system 800 may be implemented in a wireless communication device, such as a UE, base station, or other type of wireless communication device.

The features of the polar encoder device 802 will now be described. The polar encoder device 802 may include N encoder input lines, such as encoder input lines 804, 806, 808, 810, 812, 814, 816, 818, 820, 822, and 824. The value of N may be defined as $N=2^n$, where n is a positive integer, and where n≥1. In the example of FIG. 8, the polar encoder device 802 may be implemented as a 32-bit polar encoder device 802 (e.g., N=32). In this example, the polar encoder device 802 may include 32 encoder input lines, where the encoder input line 804 in FIG. 8 is the first encoder input line and the encoder input line 824 is the 32nd encoder input line.

The N encoder input lines of the polar encoder device 802 may be configured to receive respective inputs $u_1$ through $u_N$. For example, in a case where N=32, the first encoder input line 804 of the polar encoder device 802 may be configured to receive a bit at encoder input $u_1$, the ninth encoder input line 806 of the polar encoder device 802 may be configured to receive a bit at encoder input $u_9$, the tenth encoder input line 808 of the polar encoder device 802 may be configured to receive a bit at encoder input $u_{10}$, and so on. Finally, the 32nd encoder input line 824 of the polar encoder device 802 may receive a bit an encoder input $u_{32}$.

In some examples, each of the encoder input lines of the polar encoder device 802 may be associated with different channel capacities (also referred to as ranks, reliability levels, or error protection levels). For example, encoder input lines associated with higher channel capacity values may provide a higher transmission reliability for transmission of an input bit (e.g., a bit applied to encoder input $u_1$) relative to encoder input lines associated with lower channel capacity values.

For example, in a case where N=32, a bit applied to encoder input $u_1$ at the first encoder input line 804 may be transmitted with the highest reliability (e.g., the lowest bit error rate (BER)) while a bit applied to encoder input $u_{32}$ at the 32nd encoder input line 824 may be transmitted with the lowest reliability (e.g., the highest bit error rate (BER)). Therefore, the polar encoder device 802 may naturally provide different levels of error protection at different encoder input locations (e.g., at the encoder input lines 804 through 824).

The polar encoder device 802 may encode input bits applied to the encoder inputs $u_1$, $u_2$, . . . , $u_N$ to provide respective encoder output bits at encoder outputs $x_1$, $x_2$, . . . , $x_N$. The encoder output bits at the outputs $x_1$, $x_2$, . . . , $x_N$ (also referred to as a codeword, a polar codeword, or a polar encoded codeword) may be transmitted over a channel (W) 890 to a receiver device. The values $y_1$, $y_2, \ldots, y_N$ may represent the bit values received at the receiver device over the channel 890. In some examples, the receiver device may decode the values $y_1, y_2, \ldots, y_N$ to determine the—corresponding input bits applied to the inputs $u_1, u_2, \ldots, u_N$.

In an example operation of the encoding system 800, a first payload 838 to be wirelessly transmitted to a receiving device may be provided to the first CRC bit generation device 832. For example, the first payload 838 may include a first set of information bits and the first CRC bit generation device 832 may generate a first set of CRC bits 840 for the first payload 838. For example, the sequence $a_1, a_2, \ldots, a_K$ may represent K information bits (e.g., the first set of information bits) in the first payload 838, where K is a positive integer. For example, the sequence $d_1, d_2, \ldots, d_J$ may represent J CRC bits in the first set of CRC bits 840, where J is a positive integer. The first payload 838 and the first set of CRC bits 840 may be provided to the mapping device 860. In some examples, the first payload 838 and/or the first set of CRC bits 840 may be associated with a first priority level (e.g., a high priority level).

In some examples, the first CRC bit generation device 832 may generate the first set of CRC bits 840 (e.g., bits $d_1, d_2, \ldots, d_J$) for the first payload 838 when the number of bits in the first payload 838 exceeds a threshold. For example, the threshold may be 10 bits. Therefore, in these cases, if the size of the first payload 838 is relatively small (e.g., 1 or 2 bits), the first CRC bit generation device 832 may not generate the first set of CRC bits 840 or may not provide the first set of CRC bits 840 (e.g., bits $d_1, d_2, \ldots, d_J$). In some aspects of the disclosure, when the number of bits in the first payload 838 does not exceed the threshold, the UE may optionally perform inner coding (e.g., repetition coding for 1 bit, or simplex coding for 2 bits) before providing the first payload 838 to the mapping device 860.

A second payload 842 to be wirelessly transmitted to the receiving device may be provided to the second CRC bit generation device 834. For example, the second payload 842 may include a second set of information bits and the second CRC bit generation device 834 may generate a second set of CRC bits 844 for the second payload 842. For example, the sequence $b_1, b2, \ldots, b_Z$ may represent Z information bits (e.g., the second set of information bits) in the second payload 842, where Z is a positive integer. For example, the sequence $c_1, c_2, \ldots, c_M$ may represent M CRC bits in the second set of CRC bits 844, where M is a positive integer. The second payload 842 and the second set of CRC bits 844 may be provided to the mapping device 860. In some examples, the second payload 842 and/or the second set of CRC bits 844 may be associated with a second priority level (e.g., a low priority level).

In some examples, the second CRC bit generation device 834 may generate the second set of CRC bits 844 (e.g., bits $c_1, c_2, \ldots, c_M$) for the second payload 842 when the number of bits in the second payload 842 exceeds a threshold. For example, the threshold may be 10 bits. Therefore, in these cases, if the size of the second payload 842 is relatively small (e.g., 1 or 2 bits), the second CRC bit generation device 834 may not generate the second set of CRC bits 844 (e.g., bits $c_1, c_2, \ldots, c_M$) or may not provide the second set of CRC bits 844 (e.g., bits $c_1, c_2, \ldots, c_M$).

The first payload 838, the first set of CRC bits 840, the second payload 842, and the second set of CRC bits 844 may be provided to the third CRC bit generation device 836. The third CRC bit generation device 836 may generate a third set of CRC bits 846 (e.g., bits $p_1, p_2, p_3$) for the first payload 838, the first set of CRC bits 840, the second payload 842, and the second set of CRC bits 844. In some examples, the third set of CRC bits 846 may be associated with a third priority level (e.g., a priority level between the low priority level and the high priority level). The third set of CRC bits 846 (e.g., bits $p_1, p_2, p_3$) may be referred to as an outer set of CRC bits.

The third set of CRC bits 846 may mimic the three outer CRC bits (e.g., out of 11 CRC bits) typically used with polar codes. For example, the three CRC bits may facilitate list decoding (e.g., successive cancellation (SC) list decoding) at the receiving device.

In some examples, the first set of CRC bits 840 (e.g., bits $d_1, d_2, \ldots, d_J$) may be referred to as a first set of inner CRC bits, the second set of CRC bits 844 (e.g., bits $c_1, c_2, \ldots, c_M$) may be referred to as a second set of inner CRC bits, and the third set of CRC bits 846 (e.g., bits $p_1, p_2, p_3$) may be referred to as a set of outer CRC bits. In one example, the first set of CRC bits 840 (e.g., bits $d_1, d_2, \ldots, d_J$) may include eight bits (J=8), the second set of CRC bits 844 (e.g., bits $c_1, c_2, \ldots, c_M$) may include six bits (M=6), and the third set of CRC bits 846 (e.g., bits $p_1, p_2, p_3$) may include three bits. In some examples, the second set of CRC bits 844 may include a fewer number of CRC bits than the first set of CRC bits 840, because the false alarm (FA) rate requirement may be less stringent for a low priority payload.

In some examples, the first set of information bits (e.g., $a_1, a_2, \ldots, a_K$) of the first payload 838 and any CRC bits for the first payload 838 (e.g., the first set of CRC bits 840) may be associated with a first priority level, such as a high priority level. The second set of information bits (e.g., b1, b2, \ldots, $b_Z$) of the second payload 842 and any CRC bits for the second payload 842 (e.g., the second set of CRC bits 844) may be associated with a second priority level, such as a low priority level. In some examples, the third set of CRC bits 846 (e.g., bits $p_1, p_2, p_3$) may be associated with a third priority level, such as a moderate priority level between the low priority level and the high priority level.

The mapping device 860 may map the first set of information bits (e.g., $a_1, a_2, \ldots, a_K$) of the first payload 838 associated with the first priority level to a first group of inputs of the polar encoder device 802 (also referred to as a first group of inputs of the polar encoder device 802) associated with a first transmission reliability level (also herein referred to as a first reliability level). The mapping device 860 may further map any CRC bits for the first payload 838 (e.g., the first set of CRC bits 840) to the first group of inputs of the polar encoder device 802 associated with the first transmission reliability level.

For example, the mapping device 860 may define the first group of inputs of the polar encoder device 802 to include a set of inputs of the polar encoder device 802 providing the highest transmission reliability. Therefore, in one example, if the first set of information bits (e.g., $a_1, a_2, \ldots, a_K$) of the first payload 838 and the first set of CRC bits 840 for the first payload 838 include a total of 10 bits, the mapping device 860 may designate 10 inputs of the polar encoder device 802 providing the highest transmission reliability as the first group of inputs (e.g., inputs $u_1$ through $u_{10}$ in the first group 892). Therefore, the mapping device 860 may map the value of bit $a_1$ to encoder input $u_1$, may map the value of bit $a_2$ to encoder input $u_2$, and so on until all 10 bits of the first set of information bits (e.g., $a_1, a_2, \ldots, a_K$) and the first set of CRC bits 840 are mapped to encoder inputs $u_1$ through $u_{10}$ as indicated with arrows 862, 864, 866.

The mapping device 860 may further map the second set of information bits (e.g., $b_1, b_2, \ldots, b_Z$) of the second payload 842 associated with the second priority level to a second group of inputs of the polar encoder device 802 (also referred to as a second group of inputs of the polar encoder device 802) associated with a second transmission reliability level (also herein referred to as a second reliability level). The mapping device 860 may further map any CRC bits for the second payload 842 (e.g., the second set of CRC bits 844) to the second group of inputs of the polar encoder device 802 associated with the second transmission reliability level.

For example, the mapping device 860 may define the second group of inputs of the polar encoder device 802 to include a set of inputs of the polar encoder device 802 providing lower transmission reliability than the first group of inputs (e.g., the first group 892) associated with the first transmission reliability level. Therefore, in one example, if the second set of information bits (e.g., $b_1$, b2, . . . , $b_Z$) of the second payload 842 and the second set of CRC bits 844 for the second payload 842 include a total of five bits, the mapping device 860 may designate five inputs of the polar encoder device 802 providing lower transmission reliability than the first group of inputs (e.g., the first group 892). In this example, the mapping device 860 may designate inputs $u_{14}$ through $u_{18}$ as the second group 896. Therefore, the mapping device 860 may map the value of bit $b_1$ to encoder input $u_{14}$, may map the value of bit $b_2$ to encoder input $u_{15}$, and so on until all five bits of the second set of information bits (e.g., $b_1$, $b_2$, . . . , $b_Z$) and the second set of CRC bits 844 are mapped to encoder inputs $u_{14}$ through $u_{18}$ as indicated with arrows 874, 876, 878.

The mapping device 860 may map the third set of CRC bits 846 to a third group of inputs of the polar encoder device 802 (also referred to as a third group of inputs of the polar encoder device 802) associated with a third transmission reliability level (also herein referred to as a third reliability level). For example, the mapping device 860 may define the third group of inputs of the polar encoder device 802 to include a set of inputs of the polar encoder device 802 providing moderate transmission reliability, where the moderate transmission reliability is higher than the previously described low transmission reliability and lower than the high transmission reliability.

Therefore, in one example, if the third set of CRC bits 846 includes three bits (e.g., $p_1$, $p_2$, $p_3$), the mapping device 860 may designate three inputs of the polar encoder device 802 providing the moderate transmission reliability as the third group of inputs (e.g., inputs $u_{11}$ through $u_{13}$ in the third group 894). Therefore, the mapping device 860 may map the value of bit $p_1$ to encoder input $u_{11}$, may map the value of bit $p_2$ to encoder input $u_{12}$, and may map the value of bit $p_3$ to encoder input $u_{13}$ as indicated with arrows 868, 870, 872.

Therefore, in some aspects of the disclosure, the first priority level may be higher than the second and third priority levels, and the third priority level may be higher than the second priority level. In these aspects, the first transmission reliability level is higher (e.g., provides a lower BER) than the second and third transmission reliability levels, and the third transmission reliability level is higher (e.g., provides a lower BER) than the second transmission reliability level. For example, any of the first group of inputs (e.g., inputs $u_1$ through $u_{10}$ in the first group 892) associated with the first transmission reliability level provides higher transmission reliability than any of the second group of inputs (e.g., inputs $u_{14}$ through $u_{18}$ in the second group 896) associated with the second transmission reliability level and any of the third group of inputs (e.g., inputs $u_{11}$, $u_{12}$, $u_{13}$ in the third group 894) associated with the third transmission reliability level, and any of the third group of inputs associated with the third transmission reliability level provides higher transmission reliability than any of the second group of inputs associated with the second transmission reliability level.

It should be understood that in some aspects of the disclosure, the first, second, and/or third groups 892, 896, 894 of inputs of the polar encoder device 802 may not necessarily include a sequential set of inputs of the polar encoder device 802.

In some examples, after the mapping device 860 has completed mapping of information bits and any CRC bits to the inputs of the polar encoder device 802, the mapping device 860 may fill any remaining inputs (e.g., inputs $u_{19}$ through $u_N$) with frozen bits as indicated with arrows 880, 882. These remaining inputs of the polar encoder device 802 (e.g., inputs $u_{19}$ through $u_N$) may provide the lowest transmission reliability.

The polar encoder device 802 may encode input bits applied to the encoder inputs $u_1$ through $u_N$ to provide respective encoder output bits at encoder outputs $x_1$, $x_2$, . . . , $x_N$ at respective encoder output lines 826, 828, 830. The encoder output bits $x_1$ through $x_N$ may be transmitted over a channel (W) 890 to a receiver device. The values $y_1$ through $y_N$ may represent the bit values received at the receiver device over the channel 890. In some examples, the receiver device may decode the values $y_1$ through $y_N$ to determine the corresponding input bits applied to inputs $u_1$ through $u_N$.

In some aspects of the disclosure, the third priority level is higher than the first and second priority levels, and the first priority level is higher than the second priority level. In these aspects, the third transmission reliability level may be higher than the first and second transmission reliability levels, and the first transmission reliability level may be higher than the second transmission reliability level. For example, any of the third group of inputs associated with the third transmission reliability level may provide higher transmission reliability than any of the first group of inputs associated with the first transmission reliability level and any of the second group of inputs associated with the second transmission reliability level, and any of the first group of inputs associated with the first transmission reliability level may provide higher transmission reliability than any of the second group of inputs associated with the second transmission reliability level. Therefore, in these aspects, the third set of CRC bits 846 may be mapped to the inputs of the polar encoder device 802 providing the highest transmission reliability (e.g., inputs $u_1$, $u_2$, $u_3$) and the first set of information bits (e.g., $a_1$, $a_2$, . . . , $a_K$) of the first payload 838 and the first set of CRC bits 840 for the first payload 838 may be mapped to inputs providing lower transmission reliability (e.g., inputs $u_4$ through $u_{14}$).

Figure 9:
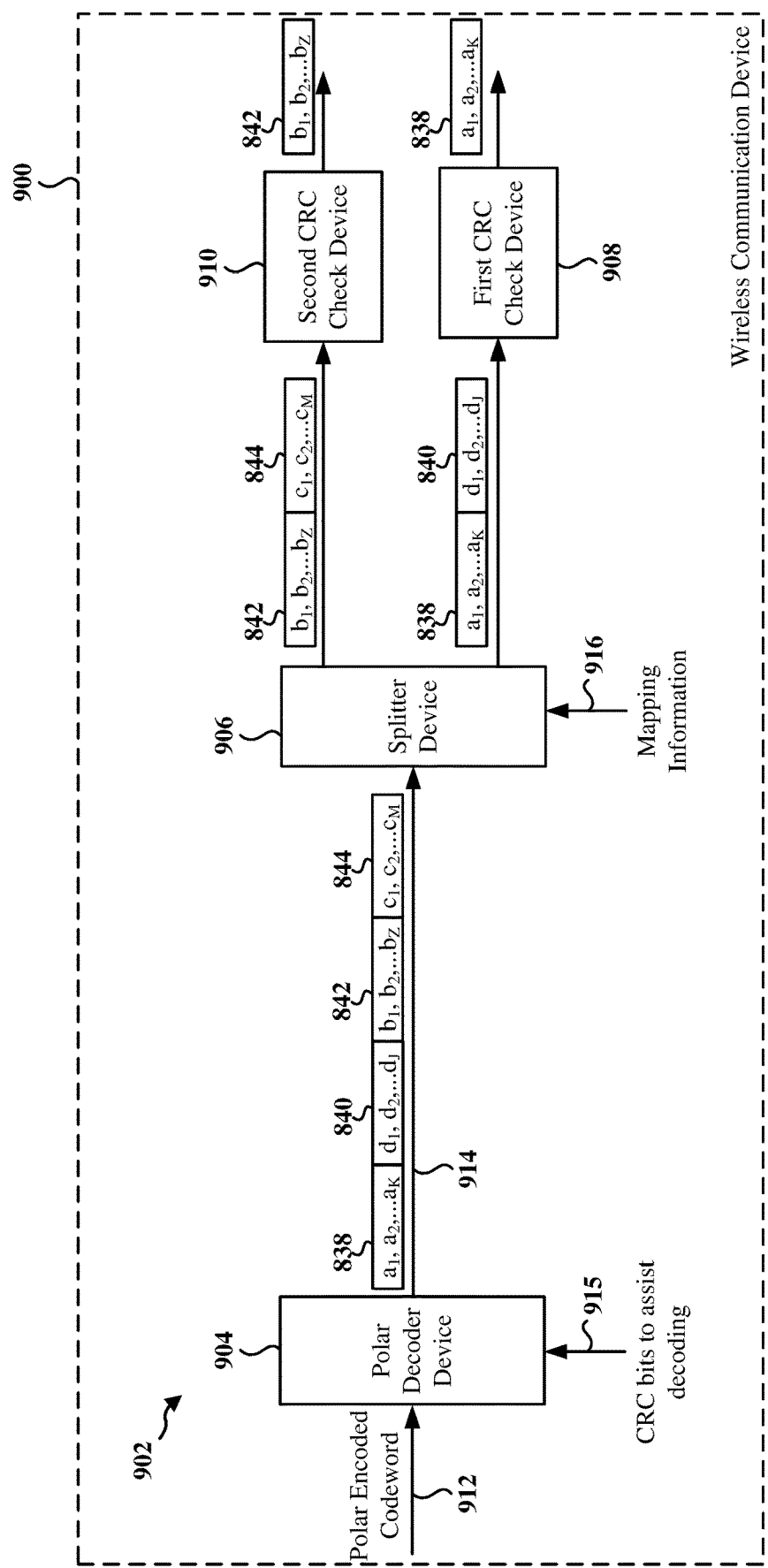
FIG. 9 illustrates an example decoding system including a polar decoder device, a splitter device, a first CRC device, and a second CRC check device in accordance with various aspects of the present disclosure.

FIG. 9 illustrates an example decoding system 902 including a polar decoder device 904, a splitter device 906, a first cyclic redundancy check (CRC) device 908, and a second CRC check device 910. In some examples, the example decoding system 902 may be implemented in a wireless communication device 900, such as a UE, base station, or other type of wireless communication device.

The wireless communication device 900 may receive a wireless transmission 912 from a transmitter device. The demodulated bits of the wireless transmission 912 may include a codeword encoded using a polar code (also referred to as a polar codeword or a polar encoded codeword). The polar decoder device 904 may decode the codeword to obtain a set of decoded bits 914. For example, the set of decoded bits may include the first set of information bits (e.g., $a_1, a_2, \ldots, a_K$) of the first payload 838, the first set of CRC bits 840 (e.g., bits $d_1, d_2, \ldots, d_J$), the second set of information bits (e.g., $b_1$, b2, ..., $b_Z$) of the second payload 842, and the second set of CRC bits 844 (e.g., bits $c_1, c_2, \ldots, c_M$). In some aspects of the disclosure, the polar decoder device 904 may use the outer CRC bits 915 (e.g., the third set of CRC bits 846 (e.g., bits $p_1, p_2, p_3$)) to assist the decoding procedure (e.g., an SC list decoding procedure).

The splitter device 906 may split (e.g., segment) the set of decoded bits 914 into two parts based on mapping information 916. For example, the mapping information 916 may enable the splitter device 906 to identify the different payloads and sets of CRC bits to which the decoded bits 914 belong. In some examples, the mapping information may be obtained from the network (e.g., a base station).

For example, the splitter device 906 may split the set of decoded bits 914 to obtain a first part including a first payload (e.g., the first payload 838) and a first set of error detection bits associated with the first payload (e.g., the first set of CRC bits 840 (e.g., bits $d_1, d_2, \ldots, d_J$)), and a second part including a second payload (e.g., the second payload 842) and a second set of error detection bits associated with the second payload (e.g., the second set of CRC bits 844 (e.g., bits $c_1, c_2, \ldots, c_M$)). The first payload and the first set of error detection bits may be associated with a first priority level, and the second payload and the second set of error detection bits may be associated with a second priority level.

The first CRC check device 908 may perform an error detection operation (e.g., a CRC check operation) for the first payload (e.g., the first payload 838) using the first set of error detection bits (e.g., the first set of CRC bits 840 (e.g., bits $d_1, d_2, \ldots, d_J$)). If the error detection operation is successful (e.g., the first payload 838 passes a CRC check with the first set of CRC bits 840), the first CRC check device 908 may declare that decoding of the first payload (e.g., the first payload 838) is successful. Otherwise, the first CRC check device 908 may declare that decoding of the first payload (e.g., the first payload 838) is unsuccessful.

The second CRC check device 910 may perform an error detection operation (e.g., a CRC check operation) for the second payload (e.g., the second payload 842) using the second set of error detection bits (e.g., the second set of CRC bits 844 (e.g., bits $c_1, c_2, \ldots, c_M$)). If the error detection operation is successful (e.g., the second payload 842 passes a CRC check with the second set of CRC bits 844), the second CRC check device 910 may declare that decoding of the second payload (e.g., the second payload 842) is successful. Otherwise, the second CRC check device 910 may declare that decoding of the second payload (e.g., the second payload 842) is unsuccessful.

In some aspects of the disclosure, a wireless communication device (e.g., a UE, base station) may concatenate a first payload, any error detection bits associated with the first payload, a second payload, and any error detection bits associated with the second payload to generate a first concatenated payload. It should be understood that in the aspects described herein, a set of error detection bits (e.g., CRC bits) may or may not be provided or obtained for a particular payload based on a size of the payload (e.g., a set of error detection bits may not be provided or obtained for a payload if the payload is too small (e.g., below a threshold number of bits)) and/or based on a network configuration (e.g., a set of error detection bits may not be provided or obtained for a payload if the network configuration indicates that error detection bits are not to be obtained for a particular payload). Therefore, in some scenarios, the error detection bits associated with the first payload and/or the error detection bits associated with the second payload may be omitted (or may not be obtained in the first place).

For example, the first payload and the error detection bits associated with the first payload may be associated with a first priority level (e.g., a high priority level), and the second payload and the error detection bits associated with the second payload may be associated with a second priority level (e.g., a low priority level).

The wireless communication device may obtain error detection bits for the first concatenated payload. The wireless communication device may concatenate the first concatenated payload and the error detection bits for the first concatenated payload to generate a second concatenated payload. An example of the second concatenated payload is illustrated in FIG. 10 (e.g., concatenated payload 1000).

Figure 10:
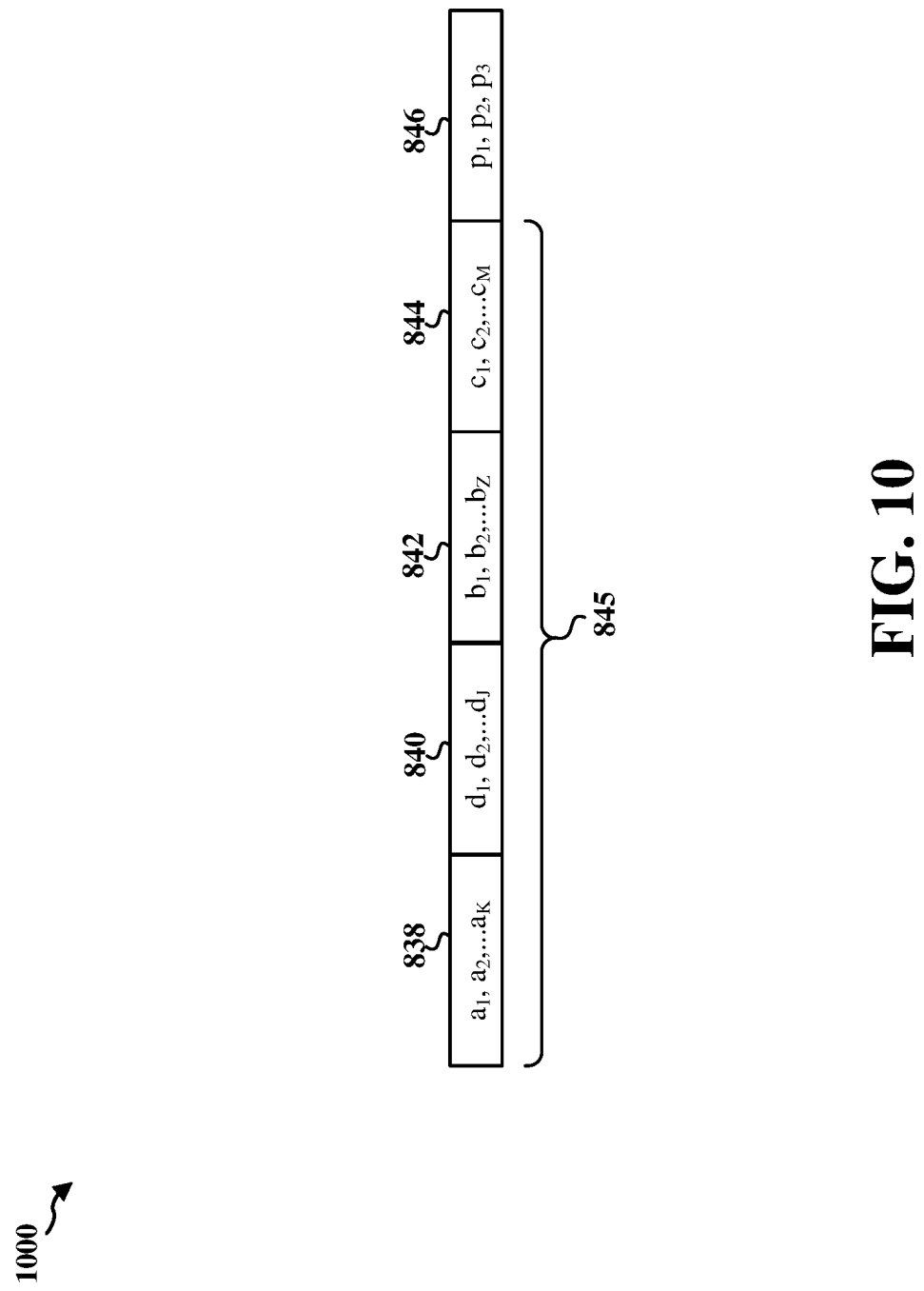
FIG. 10 illustrates a concatenated payload in accordance with various aspects of the present disclosure.

For example, with reference to FIG. 10, the wireless communication device may concatenate the first payload 838, the first set of CRC bits 840 (e.g., bits $d_1, d_2, \ldots, d_J$) associated with the first payload 838, the second payload 842, and the second set of CRC bits 844 (e.g., bits $c_1, c_2, \ldots, c_M$) associated with the second payload 842 to generate a first concatenated payload 845. The wireless communication device may concatenate the first concatenated payload 845 and the third set of CRC bits 846 (e.g., bits $p_1, p_2, p_3$) for the first concatenated payload 845 to generate the second concatenated payload 1000.

The wireless communication device may sequentially map the bits of the second concatenated payload (e.g., the second concatenated payload 1000) to the inputs of a polar encoder device (e.g., the polar encoder device 802) according to increasing indices of the plurality of inputs. For example, a first bit of the second concatenated payload may be mapped to an input of the polar encoder device providing a highest transmission reliability. Each successive bit of the second concatenated payload may be mapped to a corresponding successive input of the polar encoder device. For example, considering a polar encoder device including N inputs (e.g., the polar encoder device 802), the sequence of bits $a_1, a_2, \ldots a_K, d_1, d_2, \ldots d_J, b_1$, b2, ... $b_Z, c_1, c_2, \ldots c_M,$ and $p_1, p_2, p_3$ may be sequentially mapped to inputs $u_1$ to $u_L$, where L is a positive integer equal to the number of bits in the sequence of bits $a_1, a_2, \ldots a_K, d_1, d_2, \ldots d_J, b_1$, b2, ... $b_Z, c_1, c_2, \ldots c_M,$ and $p_1, p_2, p_3$, and where L<N.

For example, the inputs $u_1$ to $u_L$ may represent information bit locations of the polar encoder device 802 (also referred to as unfrozen bit locations of the polar encoder device). The information bit locations of the polar encoder device 802 may be the complementary set of frozen bit locations, where the frozen bit locations represent the least reliable bits (e.g., inputs providing the lowest transmission reliability). The wireless communication device may transmit a codeword generated at the polar encoder device 802 based at least on the bits of the second concatenated payload (e.g., the second concatenated payload 1000).

Figure 11:
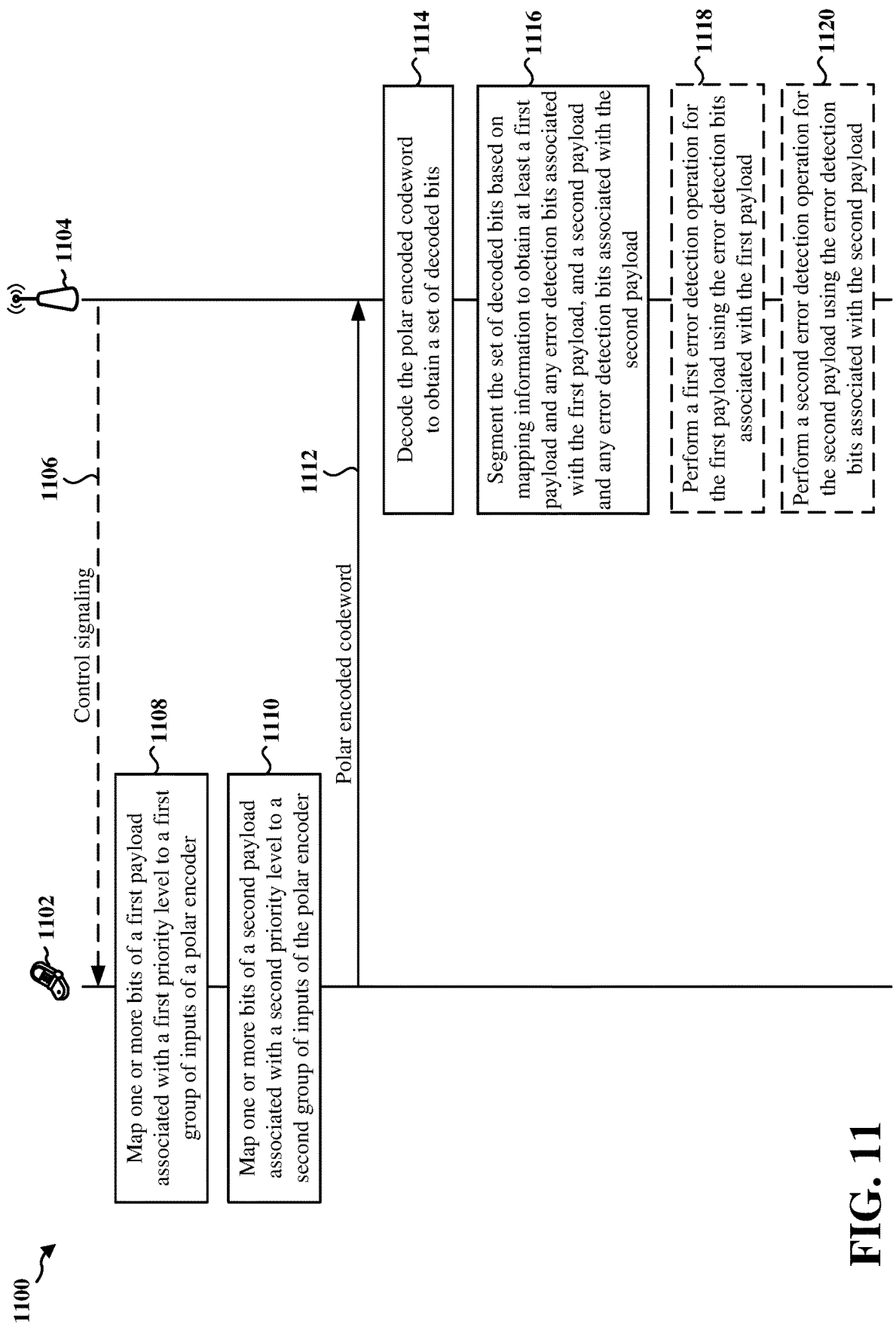
FIG. 11 is a signal flow diagram including a UE and a base station in accordance with various aspects of the present disclosure.

FIG. 11 is a signal flow diagram 1100 including a UE 1102 and a base station 1104 in accordance with various aspects of the present disclosure. In FIG. 11, operations (e.g., blocks, arrows) indicated with dashed lines represent optional operations.

The base station 1104 may transmit control signaling 1106 to the UE 1102. In some examples, the control signaling 1106 (e.g., RRC signaling) may enable or disable the third CRC bit generation device 836. In some examples, the control signaling 1106 may enable or disable the second CRC bit generation device 834. For example, the base station 1104 may disable the second CRC bit generation device 834 via the control signaling 1106 (e.g., RRC signaling) when the base station 1104 is not concerned with the false alarm (FA) performance of the second set of CRC bits 844.

At 1108, the UE 1102 may map one or more bits of a first payload associated with a first priority level to a first group of inputs of a polar encoder device. For example, the UE 1102 may implement the mapping device 860 to map the first set of information bits (e.g., $a_1, a_2, \ldots, a_K$) of the first payload 838 associated with the first priority level to a first group of inputs of the polar encoder device 802 associated with a first transmission reliability level.

At 1110, the UE 1102 may map one or more bits of a second payload associated with a second priority level to a second group of inputs of the polar encoder device. For example, the UE 1102 may implement the mapping device 860 to map the second set of information bits (e.g., $b_1, b_2, \ldots, b_Z$) of the second payload 842 associated with the second priority level to a second group of inputs of the polar encoder device 802 associated with a second transmission reliability level.

The UE 1102 may transmit a codeword 1112 (also referred to as a polar codeword or a polar encoded codeword) generated at the polar encoder device based at least on the one or more bits of the first payload and the one or more bits of the second payload. For example, the codeword 1112 may be the output bits at encoder outputs $x_1, x_2, \ldots, x_N$. For example, the UE may transmit the encoder output bits $x_1$ through $x_N$ of the polar encoder device 802 over a channel (W) 890 to the base station 1104. In some examples, one or more bits of the codeword 1112 associated with the first payload are transmitted with a first transmission reliability level and one or more bits of the codeword 1112 associated with the second payload are transmitted with a second transmission reliability level.

At 1114, the base station 1104 may decode the polar encoded codeword to obtain a set of decoded bits. For example, the base station 1104 may decode the polar encoded codeword using the polar decoder device 904 as described with reference to FIG. 9.

At 1116, the base station may segment the set of decoded bits based on mapping information to obtain at least a first payload and any error detection bits associated with the first payload, and a second payload and any error detection bits associated with the second payload. For example, the base station 1104 may use the splitter device 906 to segment the set of decoded bits based on the mapping information 916 as described with reference to FIG. 9.

At 1118, the base station 1104 may perform a first error detection operation for the first payload using the error detection bits associated with the first payload. For example, the base station 1104 may use the first CRC check device 908 to perform the first error detection operation as described with reference to FIG. 9.

At 1120, the base station may perform a second error detection operation for the second payload using the error detection bits associated with the second payload. For example, the base station 1104 may use the second CRC check device 910 to perform the second error detection operation as described with reference to FIG. 9.

Figure 12B:
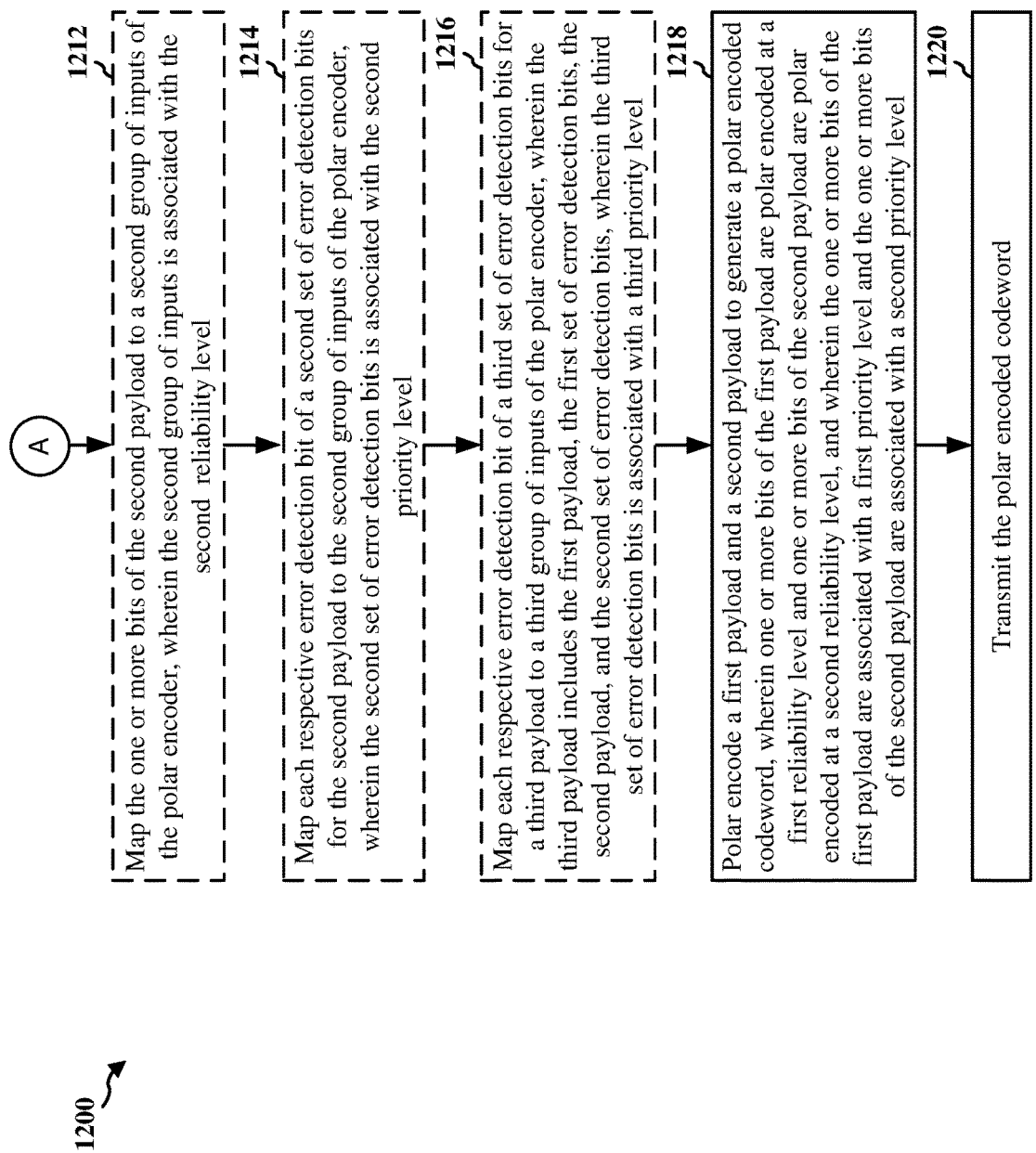

FIGS. 12A and 12B are a flowchart 1200 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359). It should be understood that the operations indicated with dashed lines in FIG. 12 represent optional operations.

With reference to FIG. 12A, at 1202, the UE obtains a first set of error detection bits for a first payload if a first size of the first payload exceeds a first threshold or if a network configuration indicates that the first set of error detection bits are to be obtained. In some examples, with reference to FIG. 8, the UE may obtain the first set of error detection bits for the first payload by implementing the first CRC bit generation device 832 to generate the first set of CRC bits 840 (e.g., bits $d_1, d_2, \ldots, d_J$). In some examples, the first threshold may be a number of bits (e.g., 10 bits).

At 1204, the UE obtains a second set of error detection bits for a second payload if a second size of the second payload exceeds a second threshold or if the network configuration indicates that the second set of error detection bits are to be obtained. In some examples, with reference to FIG. 8, the UE may obtain the second set of error detection bits for the second payload by implementing the second CRC bit generation device 834 to generate the second set of CRC bits 844 (e.g., bits $c_1, c_2, \ldots, c_M$). In some examples, the second threshold may be a number of bits (e.g., 10 bits).

At 1206, the UE obtains a third set of error detection bits for a third payload if a third size of the third payload exceeds a third threshold or if the network configuration indicates that the third set of error detection bits are to be obtained. The third payload may include the first payload, the first set of error detection bits, the second payload, and/or the second set of error detection bits. In some examples, with reference to FIG. 8, the third payload may be the first concatenated payload 845 and the UE may obtain the third set of error detection bits for the third payload by implementing the third CRC bit generation device 836 to generate the third set of CRC bits 846 (e.g., bits $p_1, p_2, p_3$). In some examples, the third threshold may be a number of bits (e.g., 10 bits).

At 1208, the UE maps the one or more bits of the first payload to a first group of inputs of a polar encoder, wherein the first group of inputs is associated with the first reliability level. For example, with reference to FIG. 8, the UE may map the first set of information bits $a_1, a_2, \ldots, a_K$ of the first payload 838 to the first group 892 of inputs of the polar encoder device 802.

At 1210, the UE maps each respective error detection bit of a first set of error detection bits for the first payload to the first group of inputs of a polar encoder, wherein the first set of error detection bits is associated with the first priority level. For example, with reference to FIG. 8, the UE may map any CRC bits for the first payload 838 (e.g., the first set of CRC bits 840) to the first group of inputs (e.g., the first group 892) of the polar encoder device 802 associated with the first reliability level.

With reference to FIG. 12B, at 1212, the UE maps the one or more bits of the second payload to a second group of inputs of the polar encoder, wherein the second group of inputs is associated with the second reliability level. For example, with reference to FIG. 8, the UE may map the second set of information bits $b_1, b2, \ldots, b_Z$ of the second payload 842 to the second group 896 of inputs of the polar encoder device 802.

At 1214, the UE maps each respective error detection bit of a second set of error detection bits for the second payload to the second group of inputs of the polar encoder, wherein the second set of error detection bits is associated with the second priority level. For example, with reference to FIG. 8, the UE may map any CRC bits for the second payload 842 (e.g., the second set of CRC bits 844) to the second group of inputs (e.g., the second group 896) of the polar encoder device 802 associated with the second reliability level.

At 1216, the UE maps each respective error detection bit of a third set of error detection bits for a third payload to a third group of inputs of the polar encoder, wherein the third payload includes the first payload, the first set of error detection bits, the second payload, and the second set of error detection bits, wherein the third set of error detection bits is associated with a third priority level. For example, with reference to FIG. 8, the UE may map the third set of CRC bits 846 for the third payload (e.g., the first concatenated payload 845) to the third group of inputs (e.g., the third group 894) of the polar encoder device 802 associated with the third reliability level.

At 1218, the UE polar encodes a first payload and a second payload to generate a polar encoded codeword. One or more bits of the first payload are polar encoded at a first reliability level and one or more bits of the second payload are polar encoded at a second reliability level, and the one or more bits of the first payload are associated with a first priority level and the one or more bits of the second payload are associated with a second priority level.

In some examples, the polar encoded codeword generated at the polar encoder may be based on the first set of error detection bits and the second set of error detection bits. In some examples, the polar encoded codeword generated at the polar encoder device may be based on the third set of error detection bits. In some examples, at least the second set of error detection bits or the third set of error detection bits are obtained based on a configuration or signaling from a base station.

In some examples, any of the first group of inputs associated with the first reliability level provides higher transmission reliability than any of the second group of inputs associated with the second reliability level and any of the third group of inputs associated with the third transmission reliability level, and any of the third group of inputs associated with the third reliability level provides higher transmission reliability than any of the second group of inputs associated with the second reliability level.

In some examples, the third priority level is higher than the first and second priority levels, the first priority level is higher than the second priority level, the third transmission reliability level is higher than the first and second reliability levels, and the first reliability level is higher than the second reliability level.

In some examples, any of the third group of inputs associated with the third reliability level provides higher transmission reliability than any of the first group of inputs associated with the first reliability level and any of the second group of inputs associated with the second reliability level, and any of the first group of inputs associated with the first reliability level provides higher transmission reliability than any of the second group of inputs associated with the second reliability level.

In some examples, the first priority level is higher than the second and third priority levels, the third priority level is higher than the second priority level, the first reliability level is higher than the second and third reliability levels, and the third reliability level is higher than the second reliability level.

In some examples, the first priority level is higher than the second priority level, and the first reliability level is higher than the second reliability level. In some examples, any of the first group of inputs associated with the first reliability level provides higher transmission reliability than any of the second group of inputs associated with the second reliability level.

In some examples, the first set of error detection bits is associated with the first priority level, the second set of error detection bits is associated with the second priority level, and the third set of error detection bits is associated with a third priority level. In these examples, if the first set of error detection bits is obtained, the UE maps each of the first set of error detection bits to the first group of inputs of the polar encoder, wherein the first group of inputs is associated with a first reliability level. If the second set of error detection bits is obtained, the UE maps each of the second set of error detection bits to the second group of inputs of the polar encoder, wherein the second group of inputs is associated with a second reliability level. If the third set of error detection bits is obtained, the UE maps each of the third set of error detection bits to the third group of inputs of the polar encoder, wherein the third group of inputs is associated with a third transmission level.

In some examples, the first priority level is higher than the second and third priority levels, the third priority level is higher than the second priority level, the first reliability level is higher than the second and third reliability levels, and the third reliability level is higher than the second reliability level. In some examples, the polar encoded codeword generated at the polar encoder is based on at least one of the first set of error detection bits, the second set of error detection bits, or the third set of error detection bits.

In some examples, any of the first group of inputs associated with the first reliability level provides higher transmission reliability than any of the second group of inputs associated with the second reliability level and any of the third group of inputs associated with the third reliability level, and any of the third group of inputs associated with the third reliability level provides higher reliability than any of the second group of inputs associated with the second reliability level.

At 1220, the UE transmits the polar encoded codeword. For example, the polar encoded codeword may be the encoder output bits at encoder outputs $x_1, x_2, \ldots, x_N$. For example, the UE may transmit the encoder output bits at encoder outputs $x_1$ through $x_N$ of the polar encoder device 802 over a channel (W) 890 to a receiver device (e.g., a base station).

Figure 13:
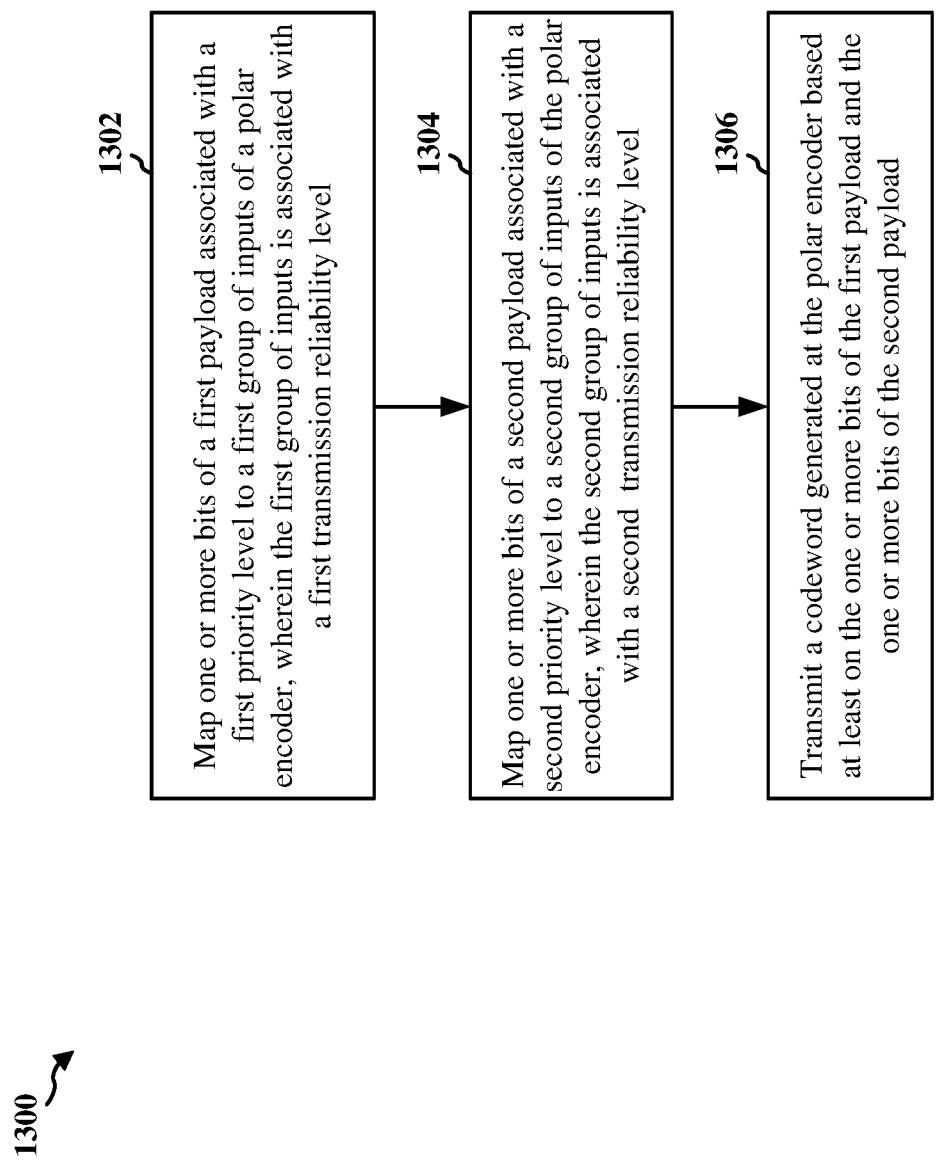
FIG. 13 is a flowchart of a method of wireless communication.

FIG. 13 is a flowchart 1300 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359).

At 1302, the UE maps one or more bits of a first payload associated with a first priority level to a first group of inputs of a polar encoder device. The first group of inputs may be associated with a first transmission reliability level. For example, the UE may map the first set of information bits $a_1, a_2, \ldots, a_K$ of the first payload 838 to the first group 892 of inputs of the polar encoder device 802.

At 1304, the UE maps one or more bits of a second payload associated with a second priority level to a second group of inputs of the polar encoder device. The second group of inputs is associated with a second transmission reliability level. For example, the UE may map the second set of information bits $b_1, b2, \ldots, b_Z$ of the second payload 842 to the second group 896 of inputs of the polar encoder device 802.

In some examples, the first priority level is higher than the second priority level, and the first transmission reliability level is higher than the second transmission reliability level. For example, any of the first group of inputs associated with the first transmission reliability level may provide higher transmission reliability than any of the second group of inputs associated with the second transmission reliability level.

Finally, at 1306, the UE transmits a codeword generated at the polar encoder device based at least on the one or more bits of the first payload and the one or more bits of the second payload. For example, the codeword may be the encoder output bits at encoder outputs $x_1, x_2, \ldots, x_N$ (also referred to a codeword, a polar codeword, or a polar encoded codeword). For example, the UE may transmit the encoder output bits at encoder outputs $x_1$ through $x_N$ of the polar encoder device 802 over a channel (W) 890 to a receiver device (e.g., a base station).

Figure 14:
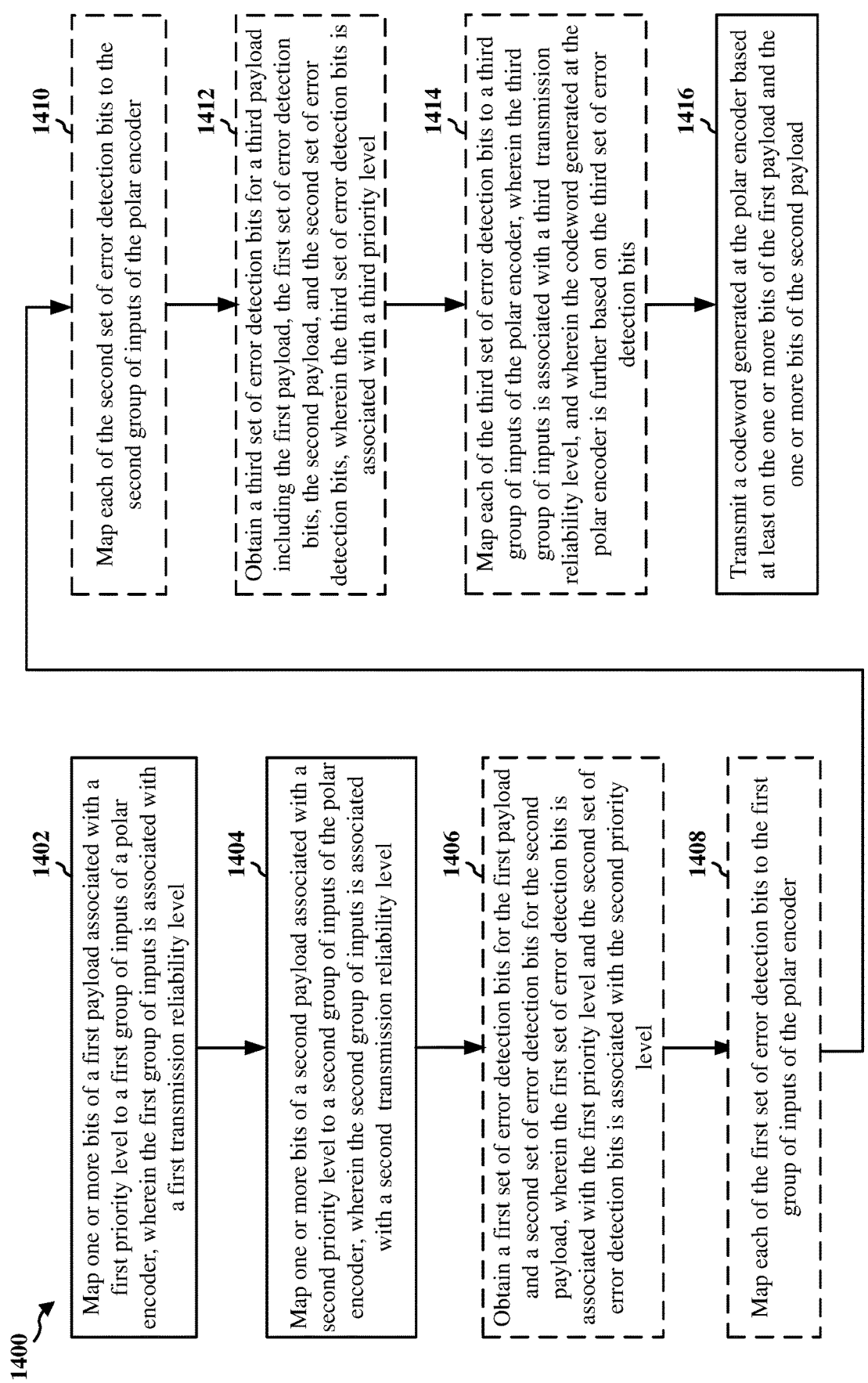
FIG. 14 is a flowchart of a method of wireless communication.

FIG. 14 is a flowchart 1400 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359). It should be understood that the operations indicated with dashed lines in FIG. 14 represent optional operations.

At 1402, the UE maps one or more bits of a first payload associated with a first priority level to a first group of inputs of a polar encoder device. The first group of inputs may be associated with a first transmission reliability level. For example, the UE may map the first set of information bits $a_1, a_2, \ldots, a_K$ of the first payload 838 to the first group 892 of inputs of the polar encoder device 802.

At 1404, the UE maps one or more bits of a second payload associated with a second priority level to a second group of inputs of the polar encoder device. The second group of inputs may be associated with a second transmission reliability level. For example, the UE may map the second set of information bits $b_1, b2, \ldots, b_Z$ of the second payload 842 to the second group 896 of inputs of the polar encoder device 802.

In some aspects of the disclosure, the first priority level is higher than the second priority level, and the first transmission reliability level is higher than the second transmission reliability level. For example, any of the first group of inputs associated with the first transmission reliability level provides higher transmission reliability than any of the second group of inputs associated with the second transmission reliability level.

At 1406, the UE obtains a first set of error detection bits for the first payload and a second set of error detection bits for the second payload. In some examples, the error detection bits for a payload may be CRC bits. For example, the first payload 838 may include a first set of information bits $a_1, a_2, \ldots, a_K$ and the first CRC bit generation device 832 may generate a first set of CRC bits 840 (e.g., bits $d_1, d_2, \ldots, d_J$) for the first payload 838. The second payload 842 may include a second set of information bits $b_1, b2, \ldots, b_Z$ and the second CRC bit generation device 834 may generate a second set of CRC bits 844 (e.g., bits $c_1, c_2, \ldots, c_M$) for the second payload 842. The first set of error detection bits may be associated with the first priority level and the second set of error detection bits may be associated with the second priority level.

In some aspects of the disclosure, the UE obtains the first set of error detection when a first number of bits in the first payload exceeds a threshold, and obtains the second set of error detection bits when a second number of bits in the second payload exceeds the threshold. In some examples, the threshold may be set to 10 bits.

At 1408, the UE maps each of the first set of error detection bits to the first group of inputs of the polar encoder device. For example, the mapping device 860 may map the first set of CRC bits 840 (e.g., bits $d_1, d_2, \ldots, d_J$) for the first payload 838 to the first group 892 of inputs of the polar encoder device 802.

At 1410, the UE maps each of the second set of error detection bits to the second group of inputs of the polar encoder device. For example, the mapping device 860 may map the second set of CRC bits 844 (e.g., bits $c_1, c_2, \ldots, c_M$) for the second payload 842 to the second group 896 of inputs of the polar encoder device 802.

At 1412, the UE obtains a third set of error detection bits for a third payload including the first payload, the first set of error detection bits, the second payload, and the second set of error detection bits. The third set of error detection bits may be associated with a third priority level. In some examples, the third payload may be the first concatenated payload 845. For example, the third CRC bit generation device 836 may generate a third set of CRC bits 846 (e.g., bits $p_1, p_2, p_3$) for the first payload 838, the first set of CRC bits 840, the second payload 842, and the second set of CRC bits 844.

At 1414, the UE maps each of the third set of error detection bits to a third group of inputs of the polar encoder device. The third group of inputs may be associated with a third transmission reliability level. For example, the mapping device 860 may map the third set of CRC bits 846 (e.g., bits $p_1, p_2, p_3$) to the third group 894 of inputs of the polar encoder device 802.

Finally, at 1416, the UE transmits a codeword generated at the polar encoder device based at least on the one or more bits of the first payload and the one or more bits of the second payload. For example, the UE may transmit the encoder output bits at encoder outputs $x_1$ through $x_N$ of the polar encoder device 802 over a channel (W) 890 to a receiver device. In some aspects of the disclosure, the codeword generated at the polar encoder device is further based on the first set of error detection bits and the second set of error detection bits.

In some aspects of the disclosure, the codeword generated at the polar encoder device is further based on the third set of error detection bits. In some aspects of the disclosure, at least the second set of error detection bits or the third set of error detection bits are obtained based on a configuration or control signaling (e.g., the control signaling 1106) from a network (e.g., from the base station 1104).

In some aspects of the disclosure, the first priority level is higher than the second and third priority levels, the third priority level is higher than the second priority level. In these aspects of the disclosure, the first transmission reliability level is higher than the second and third transmission reliability levels, and the third transmission reliability level is higher than the second transmission reliability level. For example, any of the first group of inputs associated with the first transmission reliability level may provide higher transmission reliability than any of the second group of inputs associated with the second transmission reliability level and any of the third group of inputs associated with the third transmission reliability level, and any of the third group of inputs associated with the third transmission reliability level may provide higher transmission reliability than any of the second group of inputs associated with the second transmission reliability level.

In some aspects of the disclosure, the third priority level is higher than the first and second priority levels, and the first priority level is higher than the second priority level. In these aspects, the third transmission reliability level is higher than the first and second transmission reliability levels, and the first transmission reliability level is higher than the second transmission reliability level. For example, any of the third group of inputs associated with the third transmission reliability level may provide higher transmission reliability than any of the first group of inputs associated with the first transmission reliability level and any of the second group of inputs associated with the second transmission reliability level, and any of the first group of inputs associated with the first transmission reliability level may provide higher transmission reliability than any of the second group of inputs associated with the second transmission reliability level.

Figure 15:
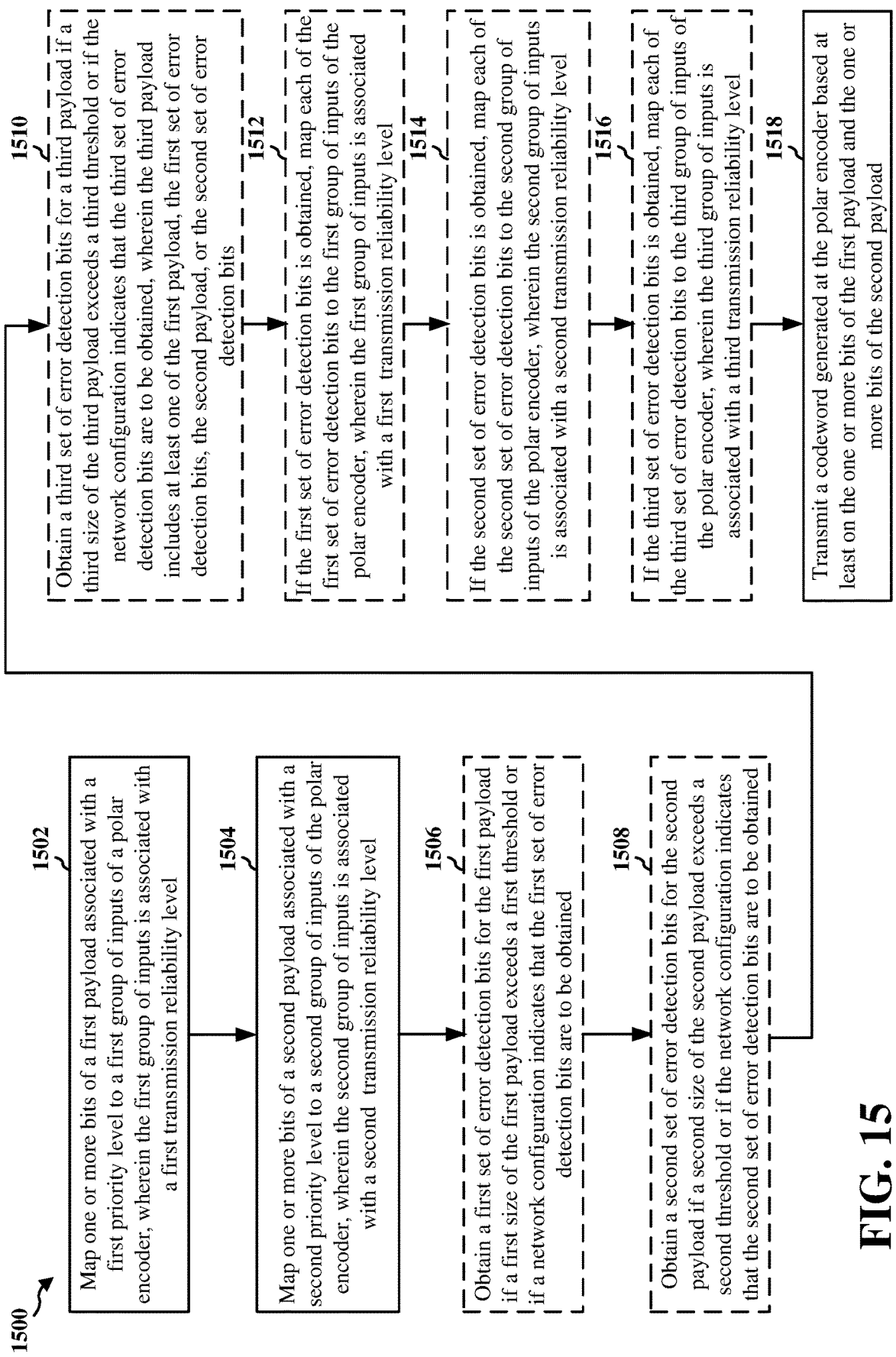
FIG. 15 is a flowchart of a method of wireless communication.

FIG. 15 is a flowchart 1500 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359). It should be understood that the operations indicated with dashed lines in FIG. 15 represent optional operations.

At 1502, the UE maps one or more bits of a first payload associated with a first priority level to a first group of inputs of a polar encoder device, wherein the first group of inputs is associated with a first transmission reliability level. For example, the UE may map the first set of information bits $a_1$, $a_2$, ..., $a_K$ of the first payload 838 to the first group 892 of inputs of the polar encoder device 802.

At 1504, the UE maps one or more bits of a second payload associated with a second priority level to a second group of inputs of the polar encoder device, wherein the second group of inputs is associated with a second transmission reliability level. For example, the UE may map the second set of information bits $b_1$, $b_2$, ..., $b_Z$ of the second payload 842 to the second group 896 of inputs of the polar encoder device 802.

At 1506, the UE obtains a first set of error detection bits for the first payload if a first size of the first payload exceeds a first threshold or if a network configuration indicates that the first set of error detection bits are to be obtained. For example, the first payload 838 may include a first set of information bits $a_1$, $a_2$, ..., $a_K$ and the first CRC bit generation device 832 may generate a first set of CRC bits 840 (e.g., bits $d_1$, $d_2$, ..., $d_J$) for the first payload 838.

At 1508, the UE obtains a second set of error detection bits for the second payload if a second size of the second payload exceeds a second threshold or if the network configuration indicates that the second set of error detection bits are to be obtained. For example, The second payload 842 may include a second set of information bits $b_1$, $b_2$, ..., $b_Z$ and the second CRC bit generation device 834 may generate a second set of CRC bits 844 (e.g., bits $c_1$, $c_2$, ..., $c_M$) for the second payload 842.

At 1510, the UE obtains a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits. In some examples, the third payload may be the first concatenated payload 845. For example, the third CRC bit generation device 836 may generate a third set of CRC bits 846 (e.g., bits $p_1$, $p_2$, $p_3$) for the first payload 838, the first set of CRC bits 840 (if obtained), the second payload 842, and the second set of CRC bits 844 (if obtained). In some examples, the first set of error detection bits is associated with the first priority level, the second set of error detection bits is associated with the second priority level, and the third set of error detection bits is associated with a third priority level.

It should be understood that in the aspects described herein, a set of error detection bits (e.g., CRC bits) may or may not be obtained for a particular payload based on a size of the payload and/or a network configuration. Therefore, in some scenarios, a set of error detection bits may be separately obtained for all of the payloads (e.g., for the first, second, and third payloads), while in other scenarios a set of error detection bits may be separately obtained for only some of the payloads (e.g., obtained for the first payload, but not the second and third payloads). For example, to indicate this flexibility, the first set of CRC bits 840, the second set of CRC bits 844, and the third set of CRC bits 846 are indicated with dotted lines in FIG. 8.

In some aspects of the disclosure, the error detection bits obtaining component 1806 may obtain the first, second, and/or third set of error detection bits. In some examples, the network configuration may be included in the control signaling 1842. In some examples, the network configuration may indicate the first, second, and/or third thresholds. For example, the first, second, and third thresholds may be set to 10 bits or a different suitable number of bits.

At 1512, if the first set of error detection bits is obtained, the UE maps each of the first set of error detection bits to the first group of inputs of the polar encoder device, wherein the first group of inputs is associated with a first transmission reliability level. For example, the mapping device 860 may map the first set of CRC bits 840 (e.g., bits $d_1$, $d_2$, ..., $d_J$) for the first payload 838 to the first group 892 of inputs of the polar encoder device 802.

At 1514, if the second set of error detection bits is obtained, the UE maps each of the second set of error detection bits to the second group of inputs of the polar encoder device, wherein the second group of inputs is associated with a second transmission reliability level. For example, the mapping device 860 may map the second set of CRC bits 844 (e.g., bits $c_1$, $c_2$, ..., $c_M$) for the second payload 842 to the second group 896 of inputs of the polar encoder device 802.

At 1516, if the third set of error detection bits is obtained, the UE maps each of the third set of error detection bits to the third group of inputs of the polar encoder device, wherein the third group of inputs is associated with a third transmission reliability level. For example, the mapping device 860 may map the third set of CRC bits 846 (e.g., bits $p_1$, $p_2$, $p_3$) to the third group 894 of inputs of the polar encoder device 802.

At 1518, the UE transmits a codeword generated at the polar encoder device based at least on the one or more bits of the first payload and the one or more bits of the second payload. In some examples, the codeword generated at the polar encoder device is further based on at least one of the first set of error detection bits, the second set of error detection bits, or the second set of error detection bits.

In some examples, the first priority level is higher than the second and third priority levels, the third priority level is higher than the second priority level, the first transmission reliability level is higher than the second and third transmission reliability levels, and the third transmission reliability level is higher than the second transmission reliability level. For example, any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

Figure 16:
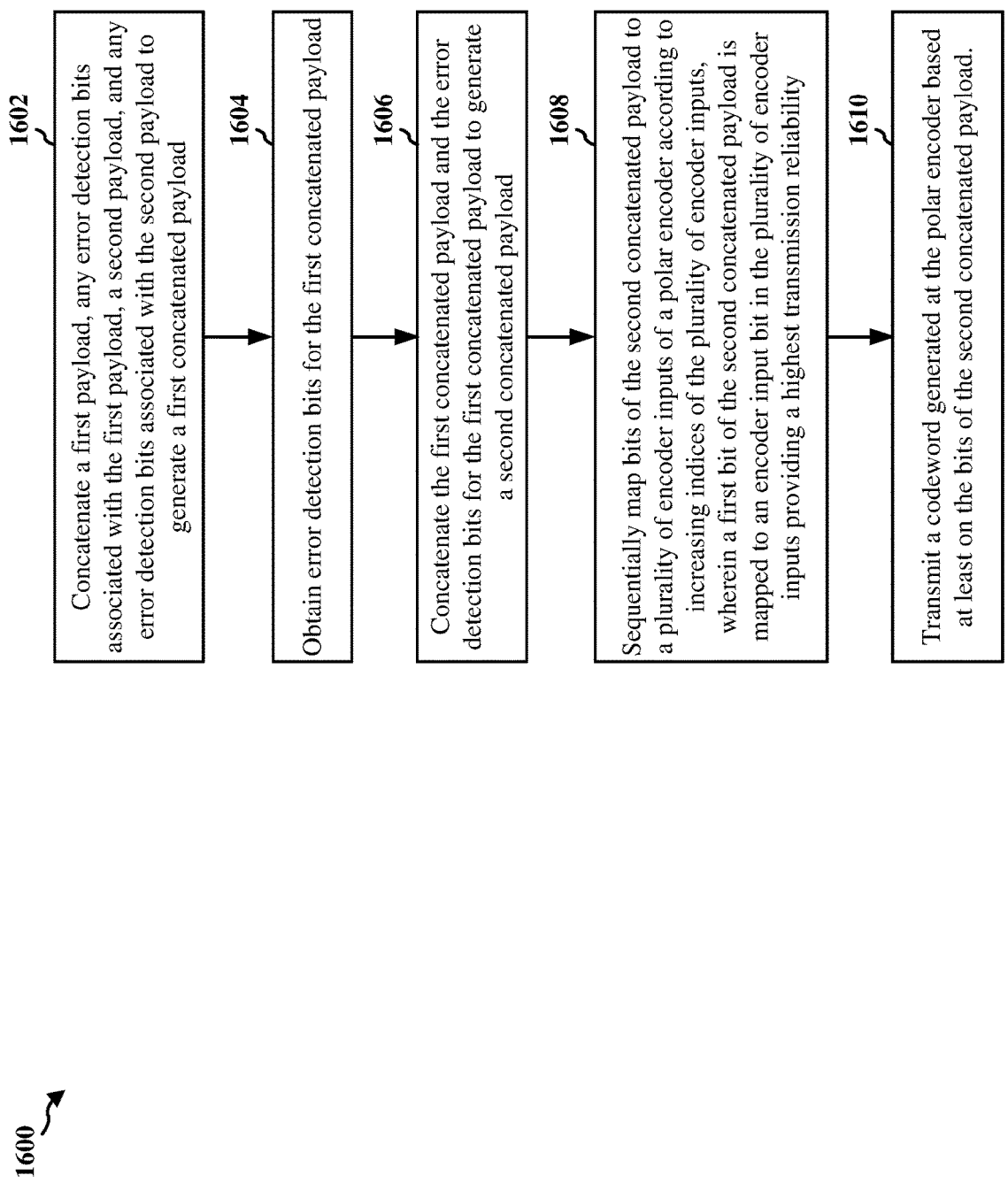
FIG. 16 is a flowchart of a method of wireless communication.

FIG. 16 is a flowchart 1600 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359).

At 1602, the UE concatenates a first payload, any error detection bits associated with the first payload, a second payload, and any error detection bits associated with the second payload to generate a first concatenated payload. For example, with reference to FIG. 10, the wireless communication device may concatenate the first payload 838, the first set of CRC bits 840 (e.g., bits $d_1, d_2, \ldots, d_J$) associated with the first payload 838, the second payload 842, and the second set of CRC bits 844 (e.g., bits $c_1, c_2, \ldots, c_M$) associated with the second payload 842 to generate a first concatenated payload 845. The first payload and the error detection bits associated with the first payload may be associated with a first priority level. The second payload and the error detection bits associated with the second payload may be associated with a second priority level.

At 1604, the UE obtains error detection bits for the first concatenated payload. For example, the error detection bits for the first concatenated payload may include the third set of CRC bits 846 (e.g., bits $p_1, p_2, p_3$) from the third CRC bit generation device 836.

At 1606, the UE concatenates the first concatenated payload and the error detection bits for the first concatenated payload to generate a second concatenated payload. For example, the UE may concatenate the first concatenated payload 845 and the third set of CRC bits 846 (e.g., bits $p_1, p_2, p_3$) for the first concatenated payload 845 to generate the second concatenated payload 1000.

At 1608, the UE sequentially maps bits of the second concatenated payload to a plurality of inputs of a polar encoder device according to increasing indices of the plurality of inputs, wherein a first bit of the second concatenated payload is mapped to an input in the plurality of inputs providing a highest transmission reliability. In some examples, the plurality of inputs excludes frozen bits.

For example, a first bit of the second concatenated payload may be mapped to an input of the polar encoder device providing a highest transmission reliability. Each successive bit of the second concatenated payload may be mapped to a corresponding successive input of the polar encoder device. For example, considering a polar encoder device including N inputs (e.g., the polar encoder device 802), the sequence of bits $a_1, a_2, \ldots, a_K, d_1, d_2, \ldots, d_J, b_1, b_2, \ldots, b_Z, c_1, c_2, \ldots c_M,$ and $p_1, p_2, p_3$ may be sequentially mapped to inputs $u_1$ to $u_L$, where L is a positive integer equal to the number of bits in the sequence of bits $a_1, a_2, \ldots, a_K, d_1, d_2, \ldots, d_J, b_1, b_2, \ldots b_Z, c_1, c_2, \ldots c_M,$ and $p_1, p_2, p_3$, and where L<N.

For example, the inputs $u_1$ to $u_L$ may represent information bit locations of the polar encoder device (also referred to as unfrozen bit locations of the polar encoder device). The information bit locations of the polar encoder device may be the complementary set of frozen bit locations, where the frozen bit locations represent the least reliable bits (e.g., inputs providing the lowest transmission reliability).

At 1610, the UE transmits a codeword generated at the polar encoder device based at least on the bits of the second concatenated payload. For example, the UE may transmit the encoder output bits at encoder outputs $x_1$ through $x_N$ of the polar encoder device 802 over a channel (W) 890 to a receiver device.

Figure 17:
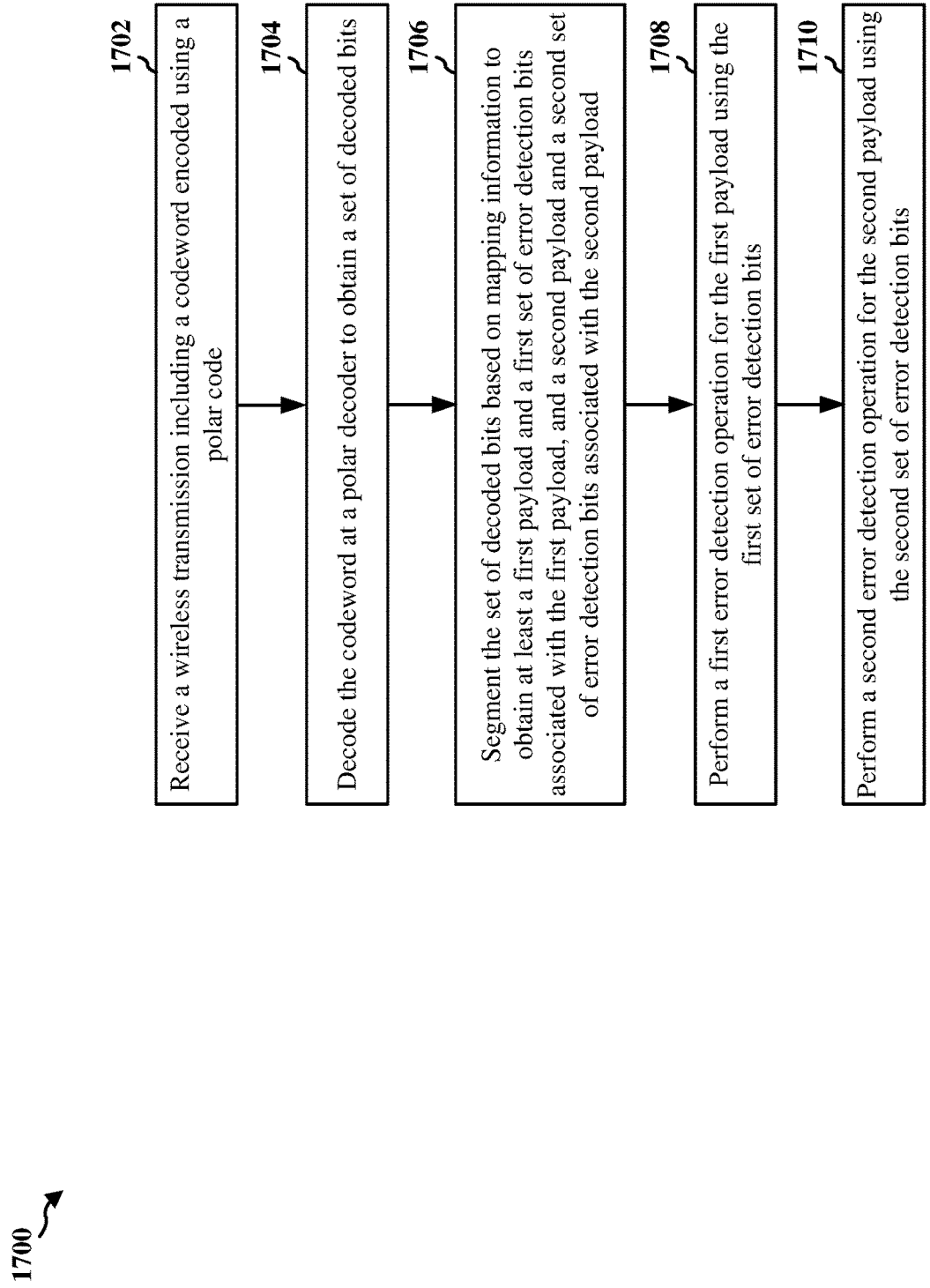
FIG. 17 is a flowchart of a method of wireless communication.

FIG. 17 is a flowchart 1700 of a method of wireless communication. The method may be performed by a UE (e.g., the UE 104, 1102; the apparatus 1802/1802'; the processing system 1914, which may include the memory 360 and which may be the entire UE 104, 1102 or a component of the UE 104, 1102, such as the TX processor 368, the RX processor 356, and/or the controller/processor 359).

At 1702, the UE receives a wireless transmission including a codeword encoded using a polar code. For example, with reference to FIG. 9, the UE may receive a wireless transmission 912 from a transmitter device (e.g., a base station).

At 1704, the UE decodes the codeword at a polar decoder to obtain a set of decoded bits. For example, the demodulated bits of the wireless transmission 912 may include a codeword encoded using a polar code (also referred to as a polar codeword or a polar encoded codeword). The polar decoder device 904 may decode the codeword to obtain a set of decoded bits 914. For example, the set of decoded bits may include the first set of information bits (e.g., $a_1, a_2, \ldots, a_K$) of the first payload 838, the first set of CRC bits 840 (e.g., bits $d_1, d_2, \ldots, d_J$), the second set of information bits (e.g., $b_1, b_2, \ldots, b_Z$) of the second payload 842, and the second set of CRC bits 844 (e.g., bits $c_1, c_2, \ldots, c_M$).

At 1706, the UE segments the set of decoded bits based on mapping information to obtain at least: a first payload and a first set of error detection bits associated with the first payload, and a second payload and a second set of error detection bits associated with the second payload. For example, with reference to FIG. 9, the splitter device 906 may split (e.g., segment) the set of decoded bits 914 into two parts based on mapping information 916. For example, the splitter device 906 may split the set of decoded bits 914 to obtain a first part including a first payload (e.g., the first payload 838) and a first set of error detection bits associated with the first payload (e.g., the first set of CRC bits 840 (e.g., bits $d_1, d_2, \ldots, d_J$), and a second part including a second payload (e.g., the second payload 842) and a second set of error detection bits associated with the second payload (e.g., the second set of CRC bits 844 (e.g., bits $c_1, c_2, \ldots, c_M$)). The first payload and the first set of error detection bits may be associated with a first priority level, and the second payload and the second set of error detection bits may be associated with a second priority level.

At 1708, the UE performs a first error detection operation for the first payload using the first set of error detection bits. For example, the first CRC check device 908 may perform an error detection operation (e.g., a CRC check operation)

for the first payload (e.g., the first payload 838) using the first set of error detection bits (e.g., the first set of CRC bits 840 (e.g., bits $d_1, d_2, \ldots, d_J$)). If the error detection operation is successful (e.g., the first payload 838 passes a CRC check with the first set of CRC bits 840), the first CRC check device 908 may declare that decoding of the first payload (e.g., the first payload 838) is successful. Otherwise, the first CRC check device 908 may declare that decoding of the first payload (e.g., the first payload 838) is unsuccessful.

Finally, at 1710, the UE performs a second error detection operation for the second payload using the second set of error detection bits. For example, the second CRC check device 910 may perform an error detection operation (e.g., a CRC check operation) for the second payload (e.g., the second payload 842) using the second set of error detection bits (e.g., the second set of CRC bits 844 (e.g., bits $c_1, c_2, \ldots, c_M$)). If the error detection operation is successful (e.g., the second payload 842 passes a CRC check with the second set of CRC bits 844), the second CRC check device 910 may declare that decoding of the second payload (e.g., the second payload 842) is successful. Otherwise, the second CRC check device 910 may declare that decoding of the second payload (e.g., the second payload 842) is unsuccessful.

Figure 18:
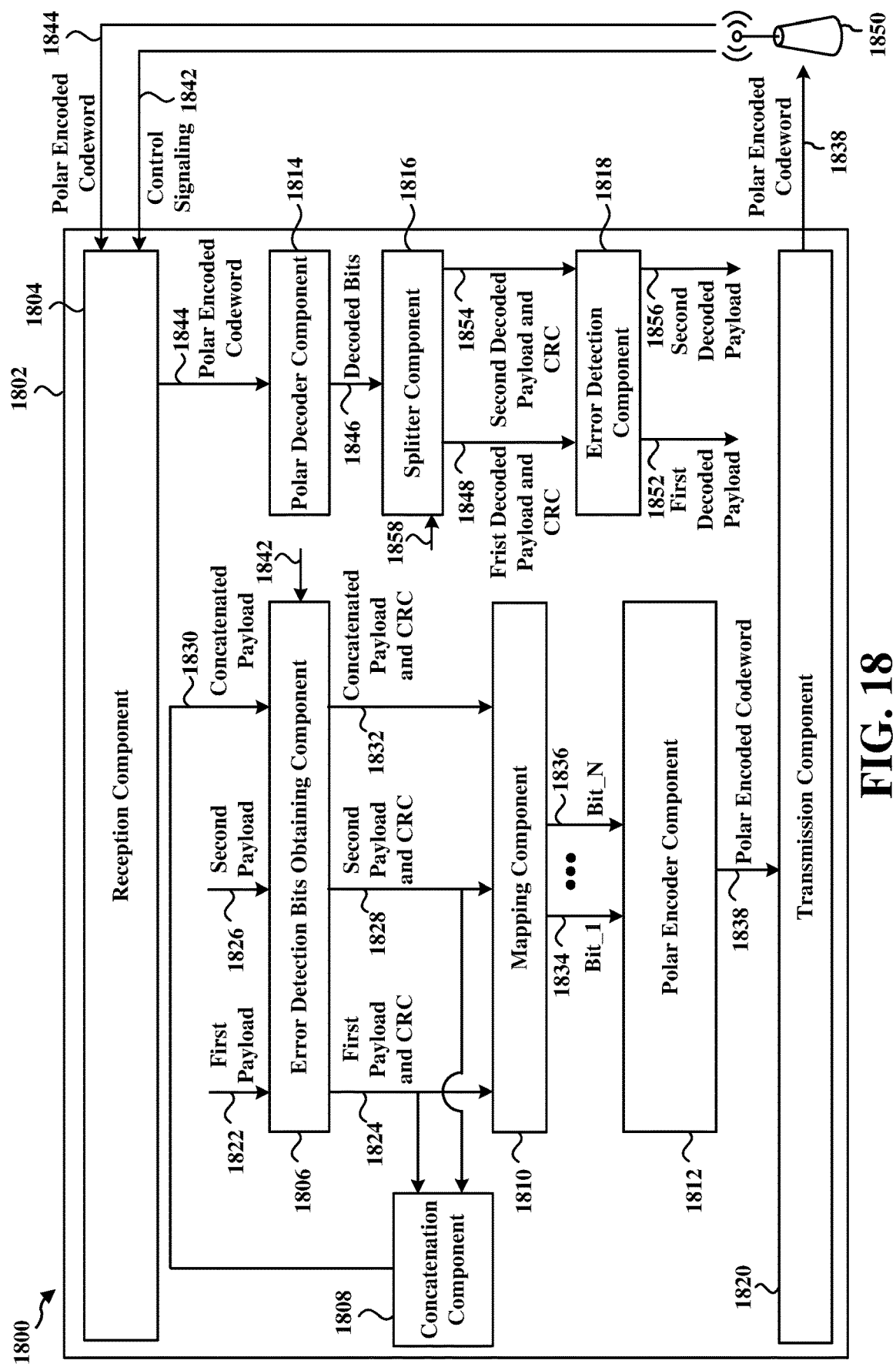
FIG. 18 is a conceptual data flow diagram illustrating the data flow between different means/components in an example apparatus.

FIG. 18 is a conceptual data flow diagram 1800 illustrating the data flow between different means/components in an example apparatus 1802. The apparatus may be a UE.

The apparatus includes a reception component 1804 that receives a wireless transmission including a codeword encoded using a polar code (e.g., the first polar encoded codeword 1844 from the base station 1850)

The apparatus further includes an error detection bits obtaining component 1806 that obtains a first set of error detection bits for a first payload (e.g., the CRC bits in signal 1824 for the first payload 1822) and a second set of error detection bits for the second payload (e.g., the CRC bits in signal 1828 for the second payload 1826). For example, the first set of error detection bits may be associated with a first priority level and the second set of error detection bits may be associated with a second priority level. In some examples, the error detection bits obtaining component 1806 obtains the first set of error detection bits for the first payload when a first number of bits in the first payload exceeds a threshold, and obtains the second set of error detection bits for the second payload when a second number of bits in the second payload exceeds the threshold.

In some examples, the error detection bits obtaining component 1806 further obtains a third set of error detection bits for a third payload including the first payload, the first set of error detection bits, the second payload, and the second set of error detection bits. For example, the third payload may be the concatenated payload 1830, and the third set of error detection bits may be the CRC bits in the signal 1832. The third set of error detection bits may be associated with a third priority level. In some examples, the third priority level is higher than the first and second priority levels, the first priority level is higher than the second priority level, the third transmission reliability level is higher than the first and second transmission reliability levels, and the first transmission reliability level is higher than the second transmission reliability level.

In some examples, the error detection bits obtaining component 1806 further obtains error detection bits for a first concatenated payload (e.g., the concatenated payload 1830). In some examples, the first set of error detection bits, the second set of error detection bits and/or the third set of error detection bits are obtained based on a configuration or control signaling from a network (e.g., the control signaling 1842 from the base station 1850).

The apparatus further includes a concatenation component 1808 that concatenates a first payload (e.g., the first payload 1822), any error detection bits associated with the first payload (e.g., the CRC bits in the signal 1824), a second payload (e.g., the second payload 1826), and any error detection bits associated with the second payload (e.g., the CRC bits in the signal 1828) to generate a first concatenated payload (e.g., the concatenated payload 1830). For example, the first payload and the error detection bits associated with the first payload may be associated with the first priority level, and the second payload and the error detection bits associated with the second payload may be associated with the second priority level.

In some examples, the concatenation component 1808 may further concatenate the first concatenated payload (e.g., the concatenated payload 1830) and the error detection bits for the first concatenated payload to generate a second concatenated payload. In these examples, the concatenated payload (e.g., the concatenated payload 1830) and the CRC signal bits in the signal 1832 may together be referred to as the second concatenated payload.

The apparatus further includes a mapping component 1810 that maps one or more bits of the first payload (e.g., the first payload 1822) associated with the first priority level to a first group of inputs of the polar encoder component 1812. The first group of inputs is associated with a first transmission reliability level. The mapping component 1810 further maps one or more bits of the second payload (e.g., the second payload 1826) associated with the second priority level to a second group of inputs of the polar encoder component 1812. The second group of inputs is associated with a second transmission reliability level. For example, the bits 1 through N (e.g., (e.g., signals Bit_1 1834 to Bit_N 1836) mapped to the polar encoder component 1812 may correspond to the one or more bits of the first payload and the one or more bits of the second payload. In some examples, the mapping component 1810 may correspond to the mapping device 860 in FIG. 8.

For example, the first priority level may be higher than the second priority level, and the first transmission reliability level may be higher than the second transmission reliability level. For example, any of the first group of inputs associated with the first transmission reliability level provides higher transmission reliability than any of the second group of inputs associated with the second transmission reliability level.

The mapping component 1810 further maps each of the first set of error detection bits to the first group of inputs of the polar encoder component 1812, and maps each of the second set of error detection bits to the second group of inputs of the polar encoder component 1812. The mapping component 1810 further maps each of the third set of error detection bits to a third group of inputs of the polar encoder component 1812. The third group of inputs may be associated with a third transmission reliability level. For example, the bits 1 through N (e.g., (e.g., signals Bit_1 1834 to Bit_N 1836) mapped to the polar encoder component 1812 may correspond to the one or more bits of the first payload, the first set of error detection bits, the one or more bits of the second payload, the second set of error detection bits, and the third set of error correction bits.

In some examples, the first priority level is higher than the second and third priority levels, the third priority level is higher than the second priority level, the first transmission reliability level is higher than the second and third transmission reliability levels, and the third transmission reliability level is higher than the second transmission reliability level. For example, any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

The mapping component 1810 further sequentially maps bits of the second concatenated payload to a plurality of inputs of the polar encoder component 1812 according to increasing indices of the plurality of inputs, wherein a first bit of the second concatenated payload is mapped to an input in the plurality of inputs providing a highest transmission reliability.

The apparatus includes a polar encoder component 1812 that generates a codeword (e.g., the second polar encoded codeword 1838) based at least on the one or more bits of the first payload and the one or more bits of the second payload. In some examples, the polar encoder component 1812 generates the codeword further based on the first set of error detection bits and the second set of error detection bits. In some examples, the polar encoder component 1812 generates the codeword (e.g., the second polar encoded codeword 1838) further based on the third set of error detection bits.

The apparatus further includes a polar decoder component 1814 that decodes a codeword (e.g., the first polar encoded codeword 1844) to obtain a set of decoded bits 1846.

The apparatus further includes a splitter component 1816 that segments the set of decoded bits 1846 based on mapping information 1858 to obtain at least: a first payload and a first set of error detection bits associated with the first payload (e.g., first decoded payload and CRC bits in signal 1848), wherein the first payload and the first set of error detection bits are associated with a first priority level, and a second payload and a second set of error detection bits associated with the second payload (e.g., second decoded payload and CRC bits in signal 1854), wherein the second payload and the second set of error detection bits are associated with a second priority level.

The apparatus further includes an error detection component 1818 that performs a first error detection operation for the first payload (e.g., the first decoded payload in the signal 1848) using the first set of error detection bits (e.g., the CRC bits in the signal 1848), and performs a second error detection operation for the second payload (e.g., the second decoded payload in the signal 1854) using the second set of error detection bits (e.g., the CRC bits in the signal 1854).

The apparatus further includes a transmission component 1820 that transmits a codeword (e.g., the second polar encoded codeword 1838) based at least on the one or more bits of the first payload (e.g., the first payload 1822) and the one or more bits of the second payload (e.g., the second payload 1826). In some examples, the transmission component 1820 transmits a codeword (e.g., the second polar encoded codeword 1838) based at least on the bits of the second concatenated payload.

The apparatus may include additional components that perform each of the blocks of the algorithm in the aforementioned flowcharts of FIGS. 12-17. As such, each block in the aforementioned flowcharts of FIGS. 12-17 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 19:
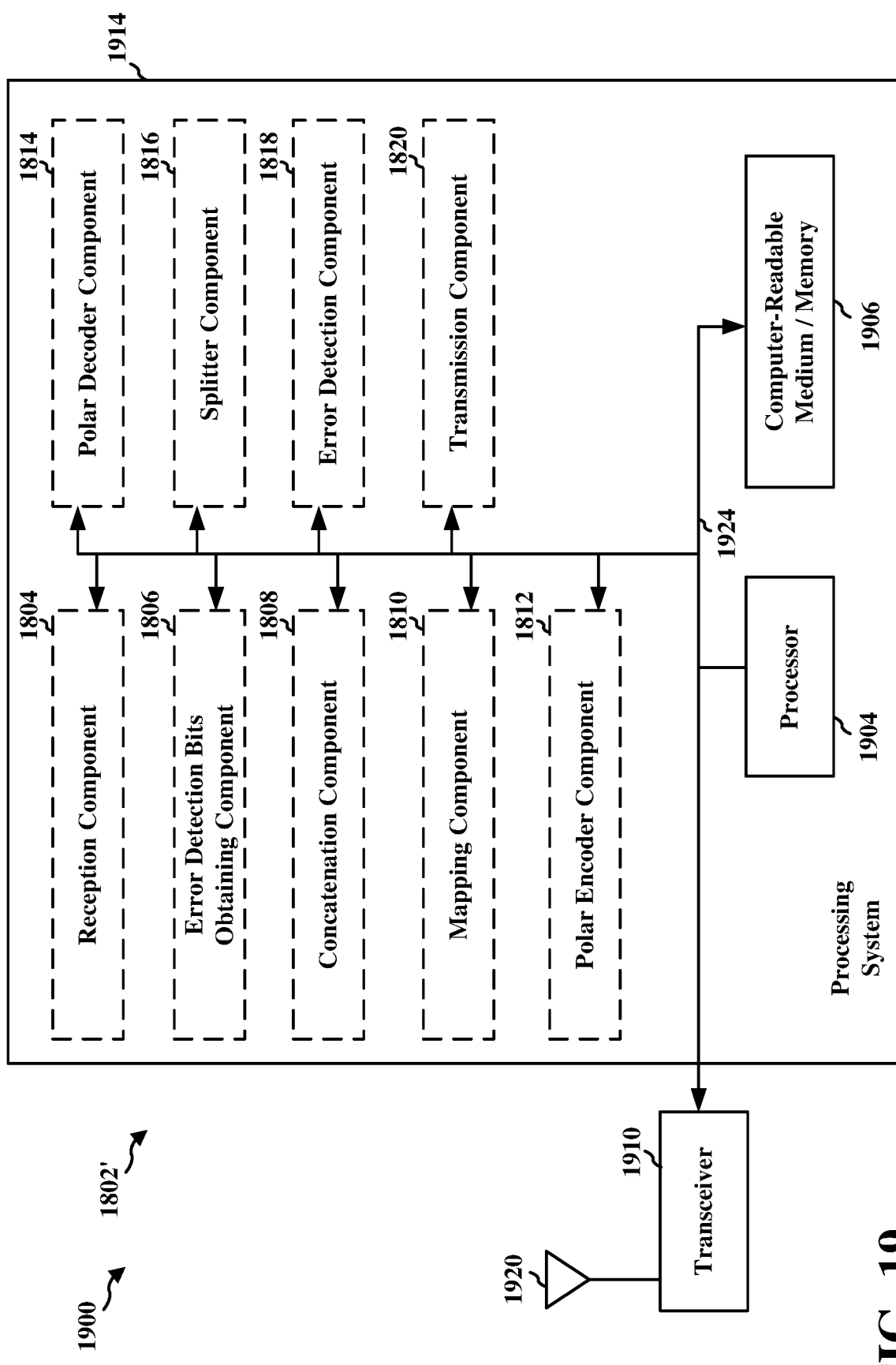
FIG. 19 is a diagram illustrating an example of a hardware implementation for an apparatus employing a processing system.

FIG. 19 is a diagram 1900 illustrating an example of a hardware implementation for an apparatus 1802' employing a processing system 1914. The processing system 1914 may be implemented with a bus architecture, represented generally by the bus 1924. The bus 1924 may include any number of interconnecting buses and bridges depending on the specific application of the processing system 1914 and the overall design constraints. The bus 1924 links together various circuits including one or more processors and/or hardware components, represented by the processor 1904, the components 1804, 1806, 1808, 1810, 1812, 1814, 1816, 1818, 1820, and the computer-readable medium/memory 1906. The bus 1924 may also link various other circuits such as timing sources, peripherals, voltage regulators, and power management circuits, which are well known in the art, and therefore, will not be described any further.

The processing system 1914 may be coupled to a transceiver 1910. The transceiver 1910 is coupled to one or more antennas 1920. The transceiver 1910 provides a means for communicating with various other apparatus over a transmission medium. The transceiver 1910 receives a signal from the one or more antennas 1920, extracts information from the received signal, and provides the extracted information to the processing system 1914, specifically the reception component 1804. In addition, the transceiver 1910 receives information from the processing system 1914, specifically the transmission component 1820, and based on the received information, generates a signal to be applied to the one or more antennas 1920. The processing system 1914 includes a processor 1904 coupled to a computer-readable medium/memory 1906. The processor 1904 is responsible for general processing, including the execution of software stored on the computer-readable medium/memory 1906. The software, when executed by the processor 1904, causes the processing system 1914 to perform the various functions described supra for any particular apparatus. The computer-readable medium/memory 1906 may also be used for storing data that is manipulated by the processor 1904 when executing software. The processing system 1914 further includes at least one of the components 1804, 1806, 1808, 1810, 1812, 1814, 1816, 1818, 1820. The components may be software components running in the processor 1904, resident/stored in the computer readable medium/memory 1906, one or more hardware components coupled to the processor 1904, or some combination thereof. The processing system 1914 may be a component of the UE 350 and may include the memory 360 and/or at least one of the TX processor 368, the RX processor 356, and the controller/processor 359. Alternatively, the processing system 1914 may be the entire UE (e.g., see 350 of FIG. 3).

In one configuration, the apparatus 1802/1802' for wireless communication includes means for causing a polar encoder to polar encode a first payload and a second payload to generate a polar encoded codeword, wherein, to polar encode the first payload and the second payload to generate the polar encoded codeword, the polar encoder is configured to encode one or more bits of the first payload at a first reliability level and encode one or more bits of the second payload at a second reliability level, wherein the one or more bits of the first payload are associated with a first priority level and the one or more bits of the second payload are associated with a second priority level, means for transmitting the polar encoded codeword, means for mapping the one or more bits of the first payload to a first group of inputs of the polar encoder, wherein the first group of inputs is associated with the first reliability level, and means for mapping the one or more bits of the second payload to a second group of inputs of the polar encoder, wherein the second group of inputs is associated with the second reliability level, means for mapping each respective error detection bit of a first set of error detection bits for the first payload to the first group of inputs of the polar encoder, wherein the first set of error detection bits is associated with the first priority level, means for mapping each respective error detection bit of a second set of error detection bits for the second payload to the second group of inputs of the polar encoder, wherein the second set of error detection bits is associated with the second priority level, wherein the polar encoded codeword is based on the first set of error detection bits and the second set of error detection bits, means for mapping each respective error detection bit of a third set of error detection bits for a third payload to a third group of inputs of the polar encoder, wherein the third payload includes the first payload, the first set of error detection bits, the second payload, and the second set of error detection bits, and wherein the third set of error detection bits is associated with a third priority level, wherein the third group of inputs is associated with a third reliability level, and wherein the polar encoded codeword is based on the third set of error detection bits.

In one configuration, the apparatus 1802/1802' for wireless communication includes means for polar encoding at least a first payload and a second payload at a polar encoder device to generate a polar encoded codeword, means for mapping one or more bits of a first payload associated with a first priority level to a first group of inputs of a polar encoder device, wherein the first group of inputs is associated with a first transmission reliability level, means for mapping one or more bits of a second payload associated with a second priority level to a second group of inputs of the polar encoder device, wherein the second group of inputs is associated with a second transmission reliability level, means for transmitting a codeword generated at the polar encoder device based at least on the one or more bits of the first payload and the one or more bits of the second payload, means for obtaining a first set of error detection bits for the first payload and a second set of error detection bits for the second payload, wherein the first set of error detection bits is associated with the first priority level and the second set of error detection bits is associated with the second priority level, means for mapping each of the first set of error detection bits to the first group of inputs of the polar encoder device, means for mapping each of the second set of error detection bits to the second group of inputs of the polar encoder device, means for obtaining a third set of error detection bits for a third payload including the first payload, the first set of error detection bits, the second payload, and the second set of error detection bits, wherein the third set of error detection bits is associated with a third priority level, means for mapping each of the third set of error detection bits to a third group of inputs of the polar encoder device, wherein the third group of inputs is associated with a third transmission reliability level, and wherein the codeword generated at the polar encoder device is further based on the third set of error detection bits, means for concatenating a first payload, any error detection bits associated with the first payload, a second payload, and any error detection bits associated with the second payload to generate a first concatenated payload, wherein the first payload and the error detection bits associated with the first payload are associated with a first priority level, and wherein the second payload and the error detection bits associated with the second payload are associated with a second priority level, means for obtaining error detection bits for the first concatenated payload, means for concatenating the first concatenated payload and the error detection bits for the first concatenated payload to generate a second concatenated payload, means for sequentially mapping bits of the second concatenated payload to a plurality of inputs of a polar encoder device according to increasing indices of the plurality of inputs, wherein a first bit of the second concatenated payload is mapped to an input in the plurality of inputs providing a highest transmission reliability, means for transmitting a polar encoded codeword, wherein one or more bits of the polar encoded codeword associated with the first payload are transmitted with a first transmission reliability level and one or more bits of the polar encoded codeword associated with the second payload are transmitted with a second transmission reliability level, means for transmitting a codeword generated at the polar encoder device based at least on the bits of the second concatenated payload.

The apparatus 1802/1802' for wireless communication further includes means for receiving a wireless transmission including a codeword encoded using a polar code, means for decoding the codeword at a polar decoder to obtain a set of decoded bits, means for segmenting the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level, means for performing a first error detection operation for the first payload using the first set of error detection bits, and means for performing a second error detection operation for the second payload using the second set of error detection bits.

The aforementioned means may be one or more of the aforementioned components of the apparatus 1802 and/or the processing system 1914 of the apparatus 1802' configured to perform the functions recited by the aforementioned means. As described supra, the processing system 1914 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Therefore, the aspects described herein enable may enable a wireless communication device (e.g., a UE, a base station) to achieve joint encoding of two or more payloads using a single polar encoder device, while providing unequal error protection for the two or more payloads. For example, the aspects described herein enable a wireless communication device to encode two or more payloads into a single polar encoded codeword for wireless transmission. The bits in the polar encoded codeword corresponding to a higher priority payload may be transmitted with higher transmission reliability than the bits in the codeword corresponding to a lower priority payload. Thus, a smaller decoding error may be achieved for the high priority payload, while a larger decoding error may occur for the low priority payload.

The following provides an overview of aspects of the present disclosure:

Aspect 1: An apparatus for wireless communication, comprising: a memory; and at least one processor coupled to the memory, wherein the at least one processor includes a polar encoder, and wherein the at least one processor is configured to: cause the polar encoder to polar encode a first payload and a second payload to generate a polar encoded codeword, wherein, to polar encode the first payload and the second payload to generate the polar encoded codeword, the polar encoder is configured to encode one or more bits of the first payload at a first reliability level and encode one or more bits of the second payload at a second reliability level, wherein the one or more bits of the first payload are associated with a first priority level and the one or more bits of the second payload are associated with a second priority level; and transmit the polar encoded codeword.

Aspect 2: The apparatus of aspect 1, wherein, to cause the polar encoder to polar encode the first payload and the second payload to generate the polar encoded codeword, the at least one processor is configured to: map the one or more bits of the first payload to a first group of inputs of the polar encoder, wherein the first group of inputs is associated with the first reliability level; and map the one or more bits of the second payload to a second group of inputs of the polar encoder, wherein the second group of inputs is associated with the second reliability level.

Aspect 3: The apparatus of aspect 1 or 2, wherein the first priority level is higher than the second priority level, and wherein the first reliability level is higher than the second reliability level.

Aspect 4: The apparatus of any of aspects 1 through 3, wherein any of the first group of inputs associated with the first reliability level provides higher transmission reliability than any of the second group of inputs associated with the second reliability level.

Aspect 5: The apparatus of any of aspects 1 through 4, wherein, to cause the polar encoder to polar encode the first payload and the second payload to generate the polar encoded codeword, the at least one processor is configured to: map each respective error detection bit of a first set of error detection bits for the first payload to a first group of inputs of the polar encoder, wherein the first set of error detection bits is associated with the first priority level; and map each respective error detection bit of a second set of error detection bits for the second payload to a second group of inputs of the polar encoder, wherein the second set of error detection bits is associated with the second priority level, wherein the polar encoded codeword is based on the first set of error detection bits and the second set of error detection bits.

Aspect 6: The apparatus of any of aspects 1 through 5, wherein: the first set of error detection bits is obtained when a first number of bits in the first payload exceeds a threshold, and the second set of error detection bits is obtained when a second number of bits in the second payload exceeds the threshold.

Aspect 7: The apparatus of any of aspects 1 through 6, wherein, to cause the polar encoder to polar encode the first payload and the second payload to generate the polar encoded codeword, the at least one processor is configured to: map each respective error detection bit of a third set of error detection bits for a third payload to a third group of inputs of the polar encoder, wherein the third payload includes the first payload, the first set of error detection bits, the second payload, and the second set of error detection bits, and wherein the third set of error detection bits is associated with a third priority level, wherein the third group of inputs is associated with a third reliability level, and wherein the polar encoded codeword is based on the third set of error detection bits.

Aspect 8: The apparatus of any of aspects 1 through 7, wherein the second set of error detection bits or the third set of error detection bits is obtained based on a configuration or signaling from a base station.

Aspect 9: The apparatus of any of aspects 1 through 8, wherein the first priority level is higher than the second and third priority levels, wherein the third priority level is higher than the second priority level, wherein the first reliability level is higher than the second and third reliability levels, and wherein the third reliability level is higher than the second reliability level.

Aspect 10: The apparatus of any of aspects 1 through 9, wherein: any of the first group of inputs associated with the first reliability level provides higher transmission reliability than any of the second group of inputs associated with the second reliability level and any of the third group of inputs associated with the third reliability level, and any of the third group of inputs associated with the third reliability level provides higher transmission reliability than any of the second group of inputs associated with the second reliability level.

Aspect 11: The apparatus of any of aspects 1 through 10, wherein the third priority level is higher than the first and second priority levels, the first priority level is higher than the second priority level, the third reliability level is higher than the first and second reliability levels, and the first reliability level is higher than the second reliability level.

Aspect 12: The apparatus of any of aspects 1 through 11, wherein: any of the third group of inputs associated with the third reliability level provides higher transmission reliability than any of the first group of inputs associated with the first reliability level and any of the second group of inputs associated with the second reliability level, and any of the first group of inputs associated with the first reliability level provides higher reliability than any of the second group of inputs associated with the second reliability level.

Aspect 13: The apparatus of any of aspects 1 through 12, wherein the at least one processor is further configured to: obtain a first set of error detection bits for the first payload if a first size of the first payload exceeds a first threshold or if a network configuration indicates that the first set of error detection bits are to be obtained; obtain a second set of error detection bits for the second payload if a second size of the second payload exceeds a second threshold or if the network configuration indicates that the second set of error detection bits are to be obtained; and obtain a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

Aspect 14: The apparatus of any of aspects 1 through 13, wherein the first set of error detection bits is associated with the first priority level, the second set of error detection bits is associated with the second priority level, and the third set of error detection bits is associated with a third priority level, wherein the at least one processor configured to polar encode the first payload and the second payload is further configured to: if the first set of error detection bits is obtained, map each of the first set of error detection bits to the first group of inputs of the polar encoder, wherein the first group of inputs is associated with a first reliability level; if the second set of error detection bits is obtained, map each of the second set of error detection bits to the second group of inputs of the polar encoder, wherein the second group of inputs is associated with a second reliability level; and if the third set of error detection bits is obtained, map each of the third set of error detection bits to a third group of inputs of the polar encoder, wherein the third group of inputs is associated with a third reliability level.

Aspect 15: The apparatus of any of aspects 1 through 14, wherein the polar encoded codeword is based on at least one of the first set of error detection bits, the second set of error detection bits, or the third set of error detection bits.

Aspect 16: The apparatus of any of aspects 1 through 15, wherein the first priority level is higher than the second and third priority levels, the third priority level is higher than the second priority level, the first reliability level is higher than the second and third reliability levels, and the third reliability level is higher than the second reliability level.

Aspect 17: The apparatus of any of aspects 1 through 16, wherein: any of the first group of inputs associated with the first reliability level provides higher transmission reliability than any of the second group of inputs associated with the second reliability level and any of the third group of inputs associated with the third reliability level, and any of the third group of inputs associated with the third reliability level provides higher transmission reliability than any of the second group of inputs associated with the second reliability level.

Aspect 18: A method of wireless communication, comprising: polar encoding a first payload and a second payload to generate a polar encoded codeword, wherein one or more bits of the first payload are polar encoded at a first reliability level and one or more bits of the second payload are polar encoded at a second reliability level, and wherein the one or more bits of the first payload are associated with a first priority level and the one or more bits of the second payload are associated with a second priority level; and transmitting the polar encoded codeword.

Aspect 19: The method of aspects 18, further comprising: mapping the one or more bits of the first payload to a first group of inputs of a polar encoder, wherein the first group of inputs is associated with the first reliability level; and mapping the one or more bits of the second payload to a second group of inputs of the polar encoder, wherein the second group of inputs is associated with the second reliability level.

Aspect 20: The method of aspect 18 or 19, wherein the first priority level is higher than the second priority level, and wherein the first reliability level is higher than the second reliability level.

Aspect 21: The method of any of aspects 18 through 20, wherein any of the first group of inputs associated with the first reliability level provides higher transmission reliability than any of the second group of inputs associated with the second reliability level.

Aspect 22: The method of any of aspects 18 through 21, further comprising: mapping each respective error detection bit of a first set of error detection bits for the first payload to a first group of inputs of a polar encoder, wherein the first set of error detection bits is associated with the first priority level; and mapping each respective error detection bit of a second set of error detection bits for the second payload to a second group of inputs of the polar encoder, wherein the second set of error detection bits is associated with the second priority level, wherein the polar encoded codeword is based on the first set of error detection bits and the second set of error detection bits.

Aspect 23: The method of any of aspects 18 through 22, wherein: the first set of error detection bits is obtained when a first number of bits in the first payload exceeds a threshold, and the second set of error detection bits is obtained when a second number of bits in the second payload exceeds the threshold.

Aspect 24: The method of any of aspects 18 through 23, further comprising: mapping each respective error detection bit of a third set of error detection bits for a third payload to a third group of inputs of the polar encoder, wherein the third payload includes the first payload, the first set of error detection bits, the second payload, and the second set of error detection bits, wherein the third set of error detection bits is associated with a third priority level, wherein the third group of inputs is associated with a third reliability level, and wherein the polar encoded codeword is based on the third set of error detection bits.

Aspect 25: The method of any of aspects 18 through 24, further comprising: obtaining a first set of error detection bits for the first payload if a first size of the first payload exceeds a first threshold or if a network configuration indicates that the first set of error detection bits are to be obtained; obtaining a second set of error detection bits for the second payload if a second size of the second payload exceeds a second threshold or if the network configuration indicates that the second set of error detection bits are to be obtained; and obtaining a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

Aspect 26: An apparatus for wireless communication, comprising: a memory; and at least one processor coupled to the memory and configured to: concatenate a first payload, any error detection bits associated with the first payload, a second payload, and any error detection bits associated with the second payload to generate a first concatenated payload, wherein the first payload and the error detection bits associated with the first payload are associated with a first priority level, and wherein the second payload and the error detection bits associated with the second payload are associated with a second priority level; obtain error detection bits for the first concatenated payload; concatenate the first concatenated payload and the error detection bits for the first concatenated payload to generate a second concatenated payload; sequentially map bits of the second concatenated payload to a plurality of inputs of a polar encoder according to increasing indices of the plurality of inputs, wherein a first bit of the second concatenated payload is mapped to an input in the plurality of inputs providing a highest reliability; and transmit a codeword generated at the polar encoder based at least on the bits of the second concatenated payload.

Aspect 27: The apparatus of aspect 26, wherein the plurality of inputs excludes frozen bits.

Aspect 28: The apparatus of aspect 26 or 27, wherein the first priority level is higher than the second priority level.

Aspect 29: An apparatus for wireless communication, comprising: a memory; and at least one processor coupled to the memory and configured to: receive a wireless transmission including a codeword encoded using a polar code; decode the codeword at a polar decoder to obtain a set of decoded bits; and segment the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

Aspect 30: The apparatus of aspect 29, wherein the at least one processor is further configured to: perform a first error detection operation for the first payload using the first set of error detection bits; and perform a second error detection operation for the second payload using the second set of error detection bits.

Aspect 31: A method of wireless communication, comprising: mapping one or more bits of a first payload associated with a first priority level to a first group of inputs of a polar encoder, wherein the first group of inputs is associated with a first transmission reliability level; mapping one or more bits of a second payload associated with a second priority level to a second group of inputs of the polar encoder, wherein the second group of inputs is associated with a second transmission reliability level; and transmitting a codeword generated at the polar encoder based at least on the one or more bits of the first payload and the one or more bits of the second payload.

Aspect 32: The method of aspect 31, wherein the first priority level is higher than the second priority level, and wherein the first transmission reliability level is higher than the second transmission reliability level.

Aspect 33: The method of aspect 31 or 32, wherein any of the first group of inputs associated with the first transmission reliability level provides higher transmission reliability than any of the second group of inputs associated with the second transmission reliability level.

Aspect 34: The method of any of aspects 31 through 33, further comprising: obtaining a first set of error detection bits for the first payload and a second set of error detection bits for the second payload, wherein the first set of error detection bits is associated with the first priority level and the second set of error detection bits is associated with the second priority level; mapping each of the first set of error detection bits to the first group of inputs of the polar encoder; and mapping each of the second set of error detection bits to the second group of inputs of the polar encoder, wherein the codeword generated at the polar encoder is further based on the first set of error detection bits and the second set of error detection bits.

Aspect 35: The method of any of aspects 31 through 34, wherein: the first set of error detection bits for the first payload is obtained when a first number of bits in the first payload exceeds a threshold, and the second set of error detection bits for the second payload is obtained when a second number of bits in the second payload exceeds the threshold.

Aspect 36: The method of any of aspects 31 through 35, further comprising: obtaining a third set of error detection bits for a third payload including the first payload, the first set of error detection bits, the second payload, and the second set of error detection bits, wherein the third set of error detection bits is associated with a third priority level; and mapping each of the third set of error detection bits to a third group of inputs of the polar encoder, wherein the third group of inputs is associated with a third transmission reliability level, and wherein the codeword generated at the polar encoder is further based on the third set of error detection bits.

Aspect 37: The method of any of aspects 31 through 36, wherein at least the second set of error detection bits or the third set of error detection bits are obtained based on a configuration or signaling from a network.

Aspect 38: The method of any of aspects 31 through 37, wherein the first priority level is higher than the second and third priority levels, the third priority level is higher than the second priority level, the first transmission reliability level is higher than the second and third transmission reliability levels, and the third transmission reliability level is higher than the second transmission reliability level.

Aspect 39: The method of any of aspects 31 through 38, wherein: any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

Aspect 40: The method of any of aspects 31 through 39, wherein the third priority level is higher than the first and second priority levels, the first priority level is higher than the second priority level, the third transmission reliability level is higher than the first and second transmission reliability levels, and the first transmission reliability level is higher than the second transmission reliability level.

Aspect 41: The method of any of aspects 31 through 40, wherein: any of the third group of inputs associated with the third transmission reliability level provides higher transmission reliability than any of the first group of inputs associated with the first transmission reliability level and any of the second group of inputs associated with the second transmission reliability level, and any of the first group of inputs associated with the first transmission reliability level provides higher transmission reliability than any of the second group of inputs associated with the second transmission reliability level.

Aspect 42: The method of any of aspects 31 through 41, further comprising: obtaining a first set of error detection bits for the first payload if a first size of the first payload exceeds a first threshold or if a network configuration indicates that the first set of error detection bits are to be obtained; obtaining a second set of error detection bits for the second payload if a second size of the second payload exceeds a second threshold or if the network configuration indicates that the second set of error detection bits are to be obtained; and obtaining a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

Aspect 43: The method of any of aspects 31 through 42, wherein the first set of error detection bits is associated with the first priority level, the second set of error detection bits is associated with the second priority level, and the third set of error detection bits is associated with a third priority level, further comprising: if the first set of error detection bits is obtained, mapping each of the first set of error detection bits to the first group of inputs of the polar encoder, wherein the first group of inputs is associated with a first transmission reliability level; if the second set of error detection bits is obtained, mapping each of the second set of error detection bits to the second group of inputs of the polar encoder, wherein the second group of inputs is associated with a second transmission reliability level; and if the third set of error detection bits is obtained, mapping each of the third set of error detection bits to the third group of inputs of the polar encoder, wherein the third group of inputs is associated with a third transmission reliability level.

Aspect 44: The method of any of aspects 31 through 43, wherein the codeword generated at the polar encoder is further based on at least one of the first set of error detection bits, the second set of error detection bits, or the second set of error detection bits.

Aspect 45: The method of any of aspects 31 through 44, wherein the first priority level is higher than the second and third priority levels, the third priority level is higher than the second priority level, the first transmission reliability level is higher than the second and third transmission reliability levels, and the third transmission reliability level is higher than the second transmission reliability level.

Aspect 46: The method of any of aspects 31 through 45, wherein: any of the first group of inputs associated with the first transmission reliability level provides higher transmission reliability than any of the second group of inputs associated with the second transmission reliability level and any of the third group of inputs associated with the third transmission reliability level, and any of the third group of inputs associated with the third transmission reliability level provides higher transmission reliability than any of the second group of inputs associated with the second transmission reliability level.

Aspect 47: An apparatus for wireless communication, comprising: a memory; and at least one processor coupled to the memory and configured to perform a method of any one of aspects 31 through 46.

Aspect 48: An apparatus for wireless communication comprising at least one means for performing a method of any one of aspects 31 through 46.

Aspect 49: A computer-readable medium storing computer executable code, the code when executed by a processor cause the processor to perform a method of any one of aspects 31 through 46.

Aspect 50: A method of wireless communication, comprising: concatenating a first payload, any error detection bits associated with the first payload, a second payload, and any error detection bits associated with the second payload to generate a first concatenated payload, wherein the first payload and the error detection bits associated with the first payload are associated with a first priority level, and wherein the second payload and the error detection bits associated with the second payload are associated with a second priority level; obtaining error detection bits for the first concatenated payload; concatenating the first concatenated payload and the error detection bits for the first concatenated payload to generate a second concatenated payload; sequentially mapping bits of the second concatenated payload to a plurality of inputs of a polar encoder device according to increasing indices of the plurality of inputs, wherein a first bit of the second concatenated payload is mapped to an input in the plurality of inputs providing a highest transmission reliability; and transmitting a codeword generated at the polar encoder device based at least on the bits of the second concatenated payload.

Aspect 51: The method of aspect 50, wherein the plurality of inputs excludes frozen bits.

Aspect 52: The method of aspect 50 or 51, wherein the first priority level is higher than the second priority level.

Aspect 53: An apparatus for wireless communication, comprising: a memory; and at least one processor coupled to the memory and configured to perform a method of any one of aspects 50 through 52.

Aspect 54: An apparatus for wireless communication comprising at least one means for performing a method of any one of aspects 50 through 52.

Aspect 55: A computer-readable medium storing computer executable code, the code when executed by a processor cause the processor to perform a method of any one of aspects 50 through 52.

Aspect 56: A method of wireless communication, comprising: receiving a wireless transmission including a codeword encoded using a polar code; decoding the codeword at a polar decoder to obtain a set of decoded bits; and segmenting the set of decoded bits based on mapping information to obtain at least: a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

Aspect 57: The method of aspect 56, further comprising: performing a first error detection operation for the first payload using the first set of error detection bits; and performing a second error detection operation for the second payload using the second set of error detection bits.

Aspect 58: An apparatus for wireless communication comprising at least one means for performing a method of any one of aspects 56 or 57.

Aspect 59: A computer-readable medium storing computer executable code, the code when executed by a processor cause the processor to perform a method of any one of aspects 56 or 57.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus for wireless communication, comprising:
   a memory; and
   at least one processor coupled to the memory, wherein the at least one processor includes a polar encoder, and wherein the at least one processor is configured to:
      obtain a first set of error detection bits for a first payload;
      obtain a second set of error detection bits for a second payload;
      cause the polar encoder to polar encode the first payload and the second payload to generate a polar encoded codeword based on the first set of error detection bits and the second set of error detection bits, wherein, to polar encode the first payload and the second payload to generate the polar encoded codeword, the polar encoder is configured to encode one or more bits of the first payload at a first reliability level and encode one or more bits of the second payload at a second reliability level, wherein the one or more bits of the first payload are associated with a first priority level and the one or more bits of the second payload are associated with a second priority level; and
      transmit the polar encoded codeword.

2. The apparatus of claim 1, wherein, to cause the polar encoder to polar encode the first payload and the second payload to generate the polar encoded codeword, the at least one processor is configured to:
   map the one or more bits of the first payload to a first group of inputs of the polar encoder, wherein the first group of inputs is associated with the first reliability level; and
   map the one or more bits of the second payload to a second group of inputs of the polar encoder, wherein the second group of inputs is associated with the second reliability level.

3. The apparatus of claim 2, wherein the first priority level is higher than the second priority level, and wherein the first reliability level is higher than the second reliability level.

4. The apparatus of claim 3, wherein any of the first group of inputs associated with the first reliability level provides higher transmission reliability than any of the second group of inputs associated with the second reliability level.

5. The apparatus of claim 2, wherein the at least one processor is further configured to:
   obtain the first set of error detection bits for the first payload if a first size of the first payload exceeds a first threshold or if a network configuration indicates that the first set of error detection bits are to be obtained;
   obtain the second set of error detection bits for the second payload if a second size of the second payload exceeds a second threshold or if the network configuration indicates that the second set of error detection bits are to be obtained; and
   obtain a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

6. The apparatus of claim 5, wherein the first set of error detection bits is associated with the first priority level, the second set of error detection bits is associated with the second priority level, and the third set of error detection bits is associated with a third priority level, wherein the at least one processor configured to polar encode the first payload and the second payload is further configured to:
   map each of the first set of error detection bits to the first group of inputs of the polar encoder, wherein the first group of inputs is associated with the first reliability level;
   map each of the second set of error detection bits to the second group of inputs of the polar encoder, wherein the second group of inputs is associated with the second reliability level; and map each of the third set of error detection bits to a third group of inputs of the polar encoder, wherein the third group of inputs is associated with a third reliability level.

7. The apparatus of claim 6, wherein the polar encoded codeword is based on at least one of the first set of error detection bits, the second set of error detection bits, or the third set of error detection bits.

8. The apparatus of claim 6, wherein the first priority level is higher than the second and third priority levels, the third priority level is higher than the second priority level, the first reliability level is higher than the second and third reliability levels, and the third reliability level is higher than the second reliability level.

9. The apparatus of claim 8, wherein:
any of the first group of inputs associated with the first reliability level provides higher transmission reliability than any of the second group of inputs associated with the second reliability level and any of the third group of inputs associated with the third reliability level, and
any of the third group of inputs associated with the third reliability level provides higher transmission reliability than any of the second group of inputs associated with the second reliability level.

10. The apparatus of claim 1, wherein, to cause the polar encoder to polar encode the first payload and the second payload to generate the polar encoded codeword, the at least one processor is configured to:
map each respective error detection bit of the first set of error detection bits for the first payload to a first group of inputs of the polar encoder, wherein the first set of error detection bits is associated with the first priority level; and
map each respective error detection bit of the second set of error detection bits for the second payload to a second group of inputs of the polar encoder, wherein the second set of error detection bits is associated with the second priority level.

11. The apparatus of claim 10, wherein:
the first set of error detection bits is obtained when a first number of bits in the first payload exceeds a threshold, and
the second set of error detection bits is obtained when a second number of bits in the second payload exceeds the threshold.

12. The apparatus of claim 10, wherein, to cause the polar encoder to polar encode the first payload and the second payload to generate the polar encoded codeword, the at least one processor is configured to:
map each respective error detection bit of a third set of error detection bits for a third payload to a third group of inputs of the polar encoder, wherein the third payload includes the first payload, the first set of error detection bits, the second payload, and the second set of error detection bits, and wherein the third set of error detection bits is associated with a third priority level, wherein the third group of inputs is associated with a third reliability level, and wherein the polar encoded codeword is based on the third set of error detection bits.

13. The apparatus of claim 12, wherein the second set of error detection bits or the third set of error detection bits is obtained based on a configuration or signaling from a base station.

14. The apparatus of claim 12, wherein the first priority level is higher than the second and third priority levels, wherein the third priority level is higher than the second priority level, wherein the first reliability level is higher than the second and third reliability levels, and wherein the third reliability level is higher than the second reliability level.

15. The apparatus of claim 12, wherein:
any of the first group of inputs associated with the first reliability level provides higher transmission reliability than any of the second group of inputs associated with the second reliability level and any of the third group of inputs associated with the third reliability level, and
any of the third group of inputs associated with the third reliability level provides higher transmission reliability than any of the second group of inputs associated with the second reliability level.

16. The apparatus of claim 12, wherein the third priority level is higher than the first and second priority levels, the first priority level is higher than the second priority level, the third reliability level is higher than the first and second reliability levels, and the first reliability level is higher than the second reliability level.

17. The apparatus of claim 16, wherein:
any of the third group of inputs associated with the third reliability level provides higher transmission reliability than any of the first group of inputs associated with the first reliability level and any of the second group of inputs associated with the second reliability level, and
any of the first group of inputs associated with the first reliability level provides higher reliability than any of the second group of inputs associated with the second reliability level.

18. A method of wireless communication, comprising:
obtaining a first set of error detection bits for a first payload;
obtaining a second set of error detection bits for a second payload;
polar encoding the first payload and the second payload to generate a polar encoded codeword based on the first set of error detection bits and the second set of error detection bits, wherein one or more bits of the first payload are polar encoded at a first reliability level and one or more bits of the second payload are polar encoded at a second reliability level, and wherein the one or more bits of the first payload are associated with a first priority level and the one or more bits of the second payload are associated with a second priority level; and
transmitting the polar encoded codeword.

19. The method of claim 18, further comprising:
mapping the one or more bits of the first payload to a first group of inputs of a polar encoder, wherein the first group of inputs is associated with the first reliability level; and
mapping the one or more bits of the second payload to a second group of inputs of the polar encoder, wherein the second group of inputs is associated with the second reliability level.

20. The method of claim 19, wherein the first priority level is higher than the second priority level, and wherein the first reliability level is higher than the second reliability level.

21. The method of claim 20, wherein any of the first group of inputs associated with the first reliability level provides higher transmission reliability than any of the second group of inputs associated with the second reliability level.

22. The method of claim 19, further comprising:
obtaining the first set of error detection bits for the first payload if a first size of the first payload exceeds a first threshold or if a network configuration indicates that the first set of error detection bits are to be obtained;

obtaining the second set of error detection bits for the second payload if a second size of the second payload exceeds a second threshold or if the network configuration indicates that the second set of error detection bits are to be obtained; and obtaining a third set of error detection bits for a third payload if a third size of the third payload exceeds a third threshold or if the network configuration indicates that the third set of error detection bits are to be obtained, wherein the third payload includes at least one of the first payload, the first set of error detection bits, the second payload, or the second set of error detection bits.

23. The method of claim 18, further comprising:

mapping each respective error detection bit of the first set of error detection bits for the first payload to a first group of inputs of a polar encoder, wherein the first set of error detection bits is associated with the first priority level; and mapping each respective error detection bit of the second set of error detection bits for the second payload to a second group of inputs of the polar encoder, wherein the second set of error detection bits is associated with the second priority level.

24. The method of claim 23, wherein:

the first set of error detection bits is obtained when a first number of bits in the first payload exceeds a threshold, and the second set of error detection bits is obtained when a second number of bits in the second payload exceeds the threshold.

25. The method of claim 23, further comprising:

mapping each respective error detection bit of a third set of error detection bits for a third payload to a third group of inputs of the polar encoder, wherein the third payload includes the first payload, the first set of error detection bits, the second payload, and the second set of error detection bits, wherein the third set of error detection bits is associated with a third priority level, wherein the third group of inputs is associated with a third reliability level, and wherein the polar encoded codeword is based on the third set of error detection bits.

26. An apparatus for wireless communication, comprising:

a memory; and at least one processor coupled to the memory and configured to:

receive a wireless transmission including a codeword encoded using a polar code;

decode the codeword at a polar decoder to obtain a set of decoded bits; and segment the set of decoded bits based on mapping information to obtain at least:

a first payload and a first set of error detection bits associated with the first payload, wherein the first payload and the first set of error detection bits are associated with a first priority level, and a second payload and a second set of error detection bits associated with the second payload, wherein the second payload and the second set of error detection bits are associated with a second priority level.

27. The apparatus of claim 26, wherein the at least one processor is further configured to:

perform a first error detection operation for the first payload using the first set of error detection bits; and perform a second error detection operation for the second payload using the second set of error detection bits.

* * * * *